US012701760B2

(12) United States Patent
Lin et al.

(10) Patent No.: US 12,701,760 B2
(45) Date of Patent: Aug. 4, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Yu-Chang Lin, Hsinchu City (TW);
Sih-Jie Liu, Hsinchu County (TW);
Po-Kang Ho, Taoyuan City (TW);
Liang-Yin Chen, Hsinchu City (TW);
Tsai-Yu Huang, Taoyuan City (TW);
Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 481 days.

(21) Appl. No.: 18/485,850

(22) Filed: Oct. 12, 2023

(65) Prior Publication Data

US 2025/0126859 A1     Apr. 17, 2025

(51) Int. Cl.
H10D 62/13 (2025.01)
H10D 30/01 (2025.01)
(Continued)

(52) U.S. Cl.
CPC ......... H10D 62/151 (2025.01); H10D 30/014 (2025.01); H10D 30/43 (2025.01); H10D 30/6729 (2025.01); H10D 30/6735 (2025.01); H10D 62/121 (2025.01); H10D 64/017 (2025.01); H10D 84/0167 (2025.01);
(Continued)

(58) Field of Classification Search
CPC .... H10D 62/151; H10D 30/014; H10D 30/43;

H10D 30/6729; H10D 30/6735; H10D 62/121; H10D 64/017; H10D 84/0167; H10D 84/017; H10D 84/0186; H10D 84/038; H10D 84/85; H10D 30/6757;
(Continued)

(56) References Cited

U.S. PATENT DOCUMENTS 6,797,555 B1 * 9/2004 Hopper ................. H10P 30/204
                                                        438/301
9,209,247 B2 12/2015 Colinge et al.
(Continued)

OTHER PUBLICATIONS

Milan Diebel et al., "Ab Initio Calculations to Model Anomalous Fluorine Behavior", Physical Review Letters, PRL 93, 245901, 2004.

*Primary Examiner* — Jeff W Natalini
*Assistant Examiner* — Nicholas Leland Hutson
(74) *Attorney, Agent, or Firm* — Maschoff Brennan

(57)                  ABSTRACT

A method for manufacturing a semiconductor device is provided. The method includes forming a plurality of semiconductor layers vertically stacked over a substrate, wherein the semiconductor layers are vertically spaced apart from each other; forming a source/drain epitaxial structure on sides of the semiconductor layers, wherein the source/drain epitaxial structure is doped with a p-type doping species; implanting fluorine ions into the source/drain epitaxial structure; after implanting fluorine ions into the source/drain epitaxial structure, performing an annealing process to diffuse the p-type doping species into a side region of a topmost one of the semiconductor layers; and forming a source/drain contact over the source/drain epitaxial structure.

20 Claims, 25 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |
| *H10P 30/20* | (2026.01) |
| *H10P 32/10* | (2026.01) |
| *H10P 32/14* | (2026.01) |

(52) U.S. Cl.

CPC ....... *H10D 84/017* (2025.01); *H10D 84/0186* (2025.01); *H10D 84/038* (2025.01); *H10D 84/85* (2025.01); *H10P 30/204* (2026.01); *H10P 30/21* (2026.01); *H10P 32/1406* (2026.01); *H10P 32/171* (2026.01)

(58) Field of Classification Search

CPC .. H10D 62/822; H10D 62/832; H10D 62/834; H01L 21/2253; H01L 21/26513

See application file for complete search history.

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2022/0093512 A1* | 3/2022 | Chang ................. | H10D 64/017 |
| 2023/0317782 A1* | 10/2023 | Xie ..................... | H10D 62/118 |
| | | | 257/288 |

* cited by examiner

PR

146 { 146b
       146a

140 { 144

142

124
122
124
120 { 124
122
124
122

110

GS

160

R1

R2

PR

GS

146 { 146b
        146a

140 { 144

142

124
122
124
120 {
122
124
122

110

160

170 ◄ R1

PR

GS

146 {
   146b
   146a
}

140 {
   144
   142
}

D2

D1

124
122
124
122
124
122

120 {

170

160

110

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
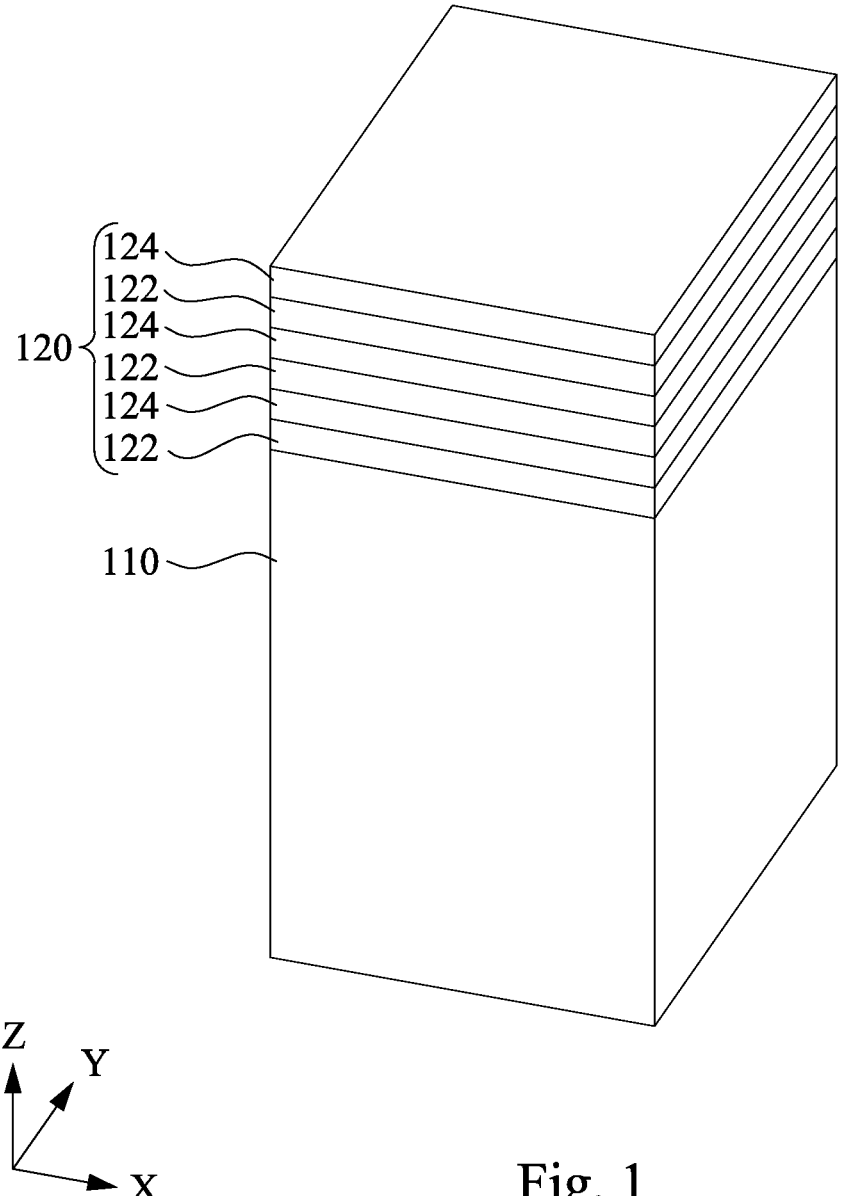
FIGS. 1-11 illustrate intermediate stages in the manufacture of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIGS. 1-11 illustrate intermediate stages in the manufacture of a semiconductor device in accordance with some embodiments of the present disclosure. FIGS. 2A, 3A, 5A, 8A, and 9A are top views of the semiconductor device at various manufacturing stages in accordance with some embodiments. FIGS. 1, 2B, 3B, 5A, 8B are schematic views of the semiconductor device in a region PR at various manufacturing stages in accordance with some embodiments. FIGS. 3C, 4B, 5C, 6A, 7 are cross-sectional views of the semiconductor device in the region PR (e.g., taken along line X1-X1 in FIGS. 2A, 3A, 5A, 8A, and 9A) at various manufacturing stages in accordance with some embodiments. FIG. 8B is a schematic view of the semiconductor device in a region NR at various manufacturing stages in accordance with some embodiments. FIGS. 8C, 9B, 10, and 11 illustrates cross-sectional views of the semiconductor device in the regions PR and NR (e.g., including a region PR taken along line X1-X1 and a region NR taken along line X2-X2 in FIGS. 8A and 9A) at various manufacturing stages in accordance with some embodiments. It is understood that additional steps may be provided before, during, and after the steps shown in FIGS. 1-11, and some of the steps described below can be replaced or eliminated for additional embodiments of the method. The order of the operations/processes may be interchangeable.

Reference is made to FIG. 1. An epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also, the substrate 110 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 120 includes sacrificial layers 122 interposed by channel layers 124. The sacrificial layers 122 and the channel layers 124 may have different semiconductor compositions from each other. In some embodiments, the sacrificial layers 122 and the channel layers 124 may include SiGe with different semiconductor compositions. For example, a Si concentration in the sacrificial layers 122 is less than a Si concentration in the channel layers 124. Stated differently, in the embodiments, a Ge concentration in the sacrificial layers 122 is greater than a Ge concentration in the channel layers 124. For example, the sacrificial layers 122 are $Si_xGe_{1-x}$, and the channel layers 124 are $Si_yGe_{1-y}$, in which x and y are in a range from 0 to 1, and y>x. However, other embodiments are possible including those that provide for the material/compositions having different oxidation rates and/or etch selectivity. In some embodiments where the sacrificial layers 122 include SiGe and the channel layers 124 include Si, the Si oxidation rate of the channel layers 124 is less than the SiGe oxidation rate of the sacrificial layers 122.

The channel layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel layers 124 may be referred to as semiconductor channels in the context. The use of the channel layers 124 to define a channel or channels of a device is further discussed below.

In some embodiments, the channel layers 124 are intrinsic semiconductor layers that are not intentionally doped, for example, not having intentionally placed dopants, but rather having a doping resulting from process contaminants. Alternatively, the channel layers 124 may be doped with a p-type or an n-type, and with a doping concentration lower than that of the source/drain epitaxial structures subsequently formed. For example, the channel layers 124 may have dopant concentration lower than about $10^{13}/cm^3$.

Figure 2A:
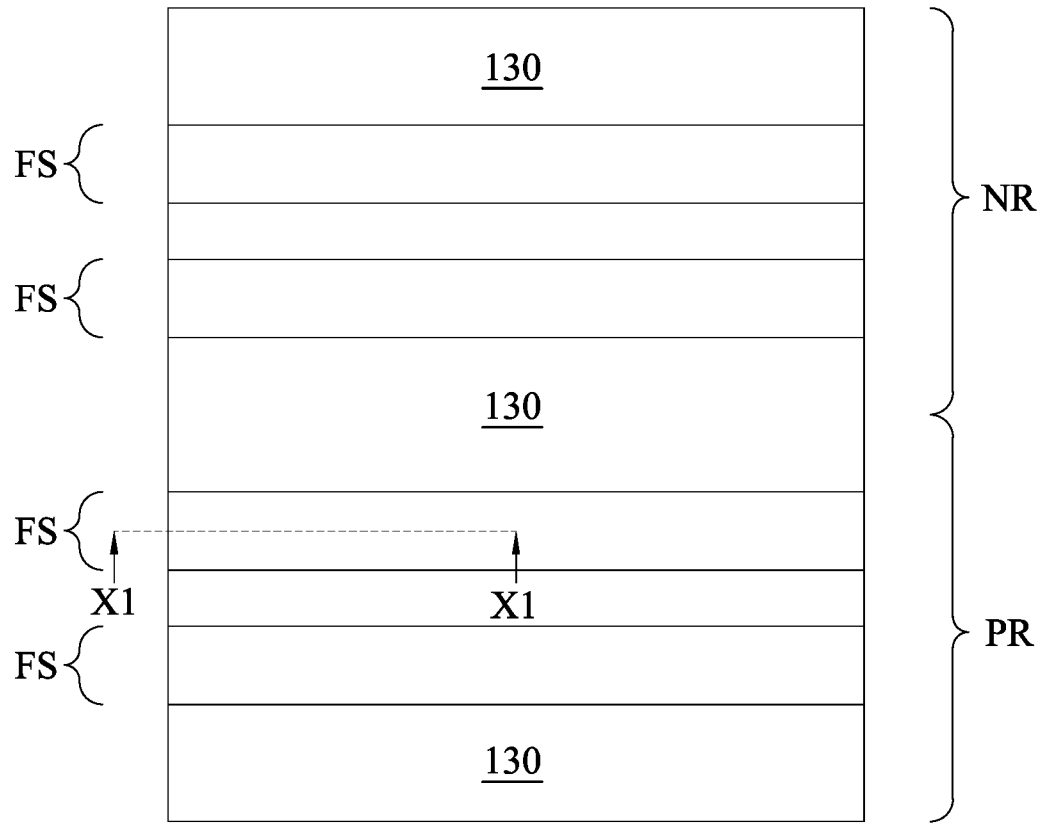
Figure 2A:
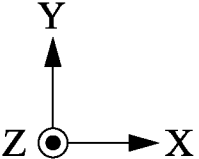
Figure 2B:
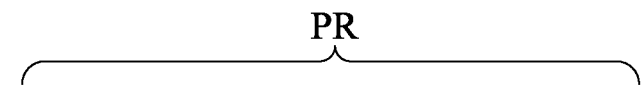
Figure 2B:
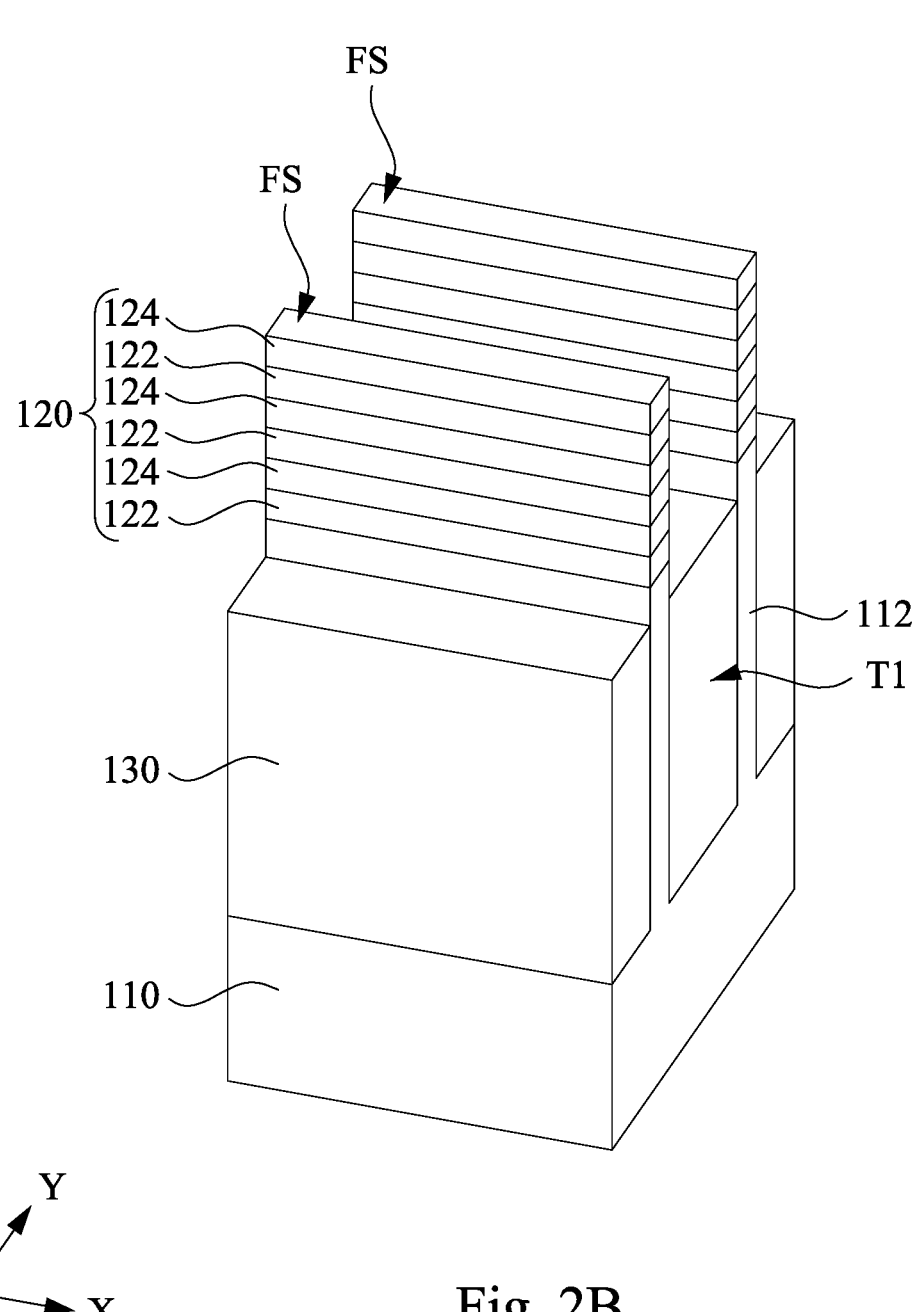

In the present embodiments, three layers of the sacrificial layers 122 and three layers of the channel layers 124 are alternately arranged as illustrated in FIG. 2B. It can be appreciated that any number of epitaxial layers can be formed in the epitaxial stack 120; the number of layers depending on the desired number of channels regions for the transistor. In some embodiments, the number of channel layers 124 is between 1 and 10, such as 2, 3, 4. The sacrificial layers 122 in channel regions(s) may eventually be removed and serve to define a vertical distance between adjacent channel region(s) for a subsequently-formed multi-gate device. In the present embodiments, the sacrificial layer 122 may have a thickness greater than that of the channel layers 124. In some other embodiments, the sacrificial layer 122 may have a thickness equal to or less than that of the channel layers 124.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the channel layers 124 include suitable semiconductor material, such as like Si, Ge, Sn, SiGe, GeSn, III-V semiconductor, the like, or the combination thereof. In some embodiments, the channel layers 124 may include a same semiconductor material as that substrate 110. In some embodiments, the epitaxially grown sacrificial layers 122 include a different material than the substrate 110. For example, the sacrificial layers 122 include suitable semiconductor material, such as Si, Ge, SiGe, GeSn, III-V semiconductor, the like, or the combination thereof. In some other embodiments, at least one of the layers 122 and 124 may include other materials such as a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As discussed, the materials of the layers 122 and 124 may be chosen based on providing differing oxidation and/or etching selectivity properties. In some embodiments, the layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Reference is made to FIGS. 2A and 2B. A plurality of semiconductor fins FS extending from the substrate 110 are formed. The semiconductor fins FS may extend substantially along a same direction X. In various embodiments, each of the fins FS includes a substrate portion 112 formed from the substrate 110 and portions of each of the epitaxial layers of the epitaxial stack 120 including epitaxial layers 122 and 124. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120. The etching process can include dry etching, wet etching, reactive ion etching (RIE), and/or other suitable processes.

In some embodiments, a hard mask (HM) layer is formed over the epitaxial stack 120 prior to patterning the fins FS. In some embodiments, the HM layer includes an oxide layer (e.g., a pad oxide layer that may include SiO2) and a nitride layer (e.g., a pad nitride layer that may include $Si_3N_4$) formed over the oxide layer. The fins FS may subsequently be fabricated using suitable processes including photolithography and etch processes. The photolithography process may include forming a photoresist layer (not shown) over the HM layer, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the substrate 110, and layers formed thereupon, while an etch process forms trenches T1 in unprotected regions through the HM layer, through the epitaxial stack 120, and into the substrate 110, thereby leaving the plurality of extending fins FS. The trenches T1 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS. The HM layer may be removed from the fins FS by suitable process after the fin patterning process.

The substrate 110 may include a p-type region PR and a n-type region NR, and the fins FS are formed in the p-type region PR and the n-type region NR. In some embodiments, a p-type device is to be formed in the p-type region PR, an n-type device is to be formed in the n-type region NR. In such embodiments, a p-type well may be formed in the n-type region NR, and/or a n-type well may be formed in the p-type region PR.

Isolation structures 130 are formed in the trench T1 between the fins FS. The isolation structure 130 may be a single-layer or a multi-layer structure. In some embodiments, the isolation structure 130 includes low-k (k<7) dielectric materials, SiN, SiCN, SiOC, SiOCN or the like. Formation of the isolation structure 130 may include depositing a dielectric material over the fins FS, followed by an etching back process. Through the etching back process, a top surface of the isolation structure 130 is lowered to a position lower than a bottommost surface of the layers 122, such that the sacrificial layers 122 and the channel layers 124 are exposed.

Figure 3A:
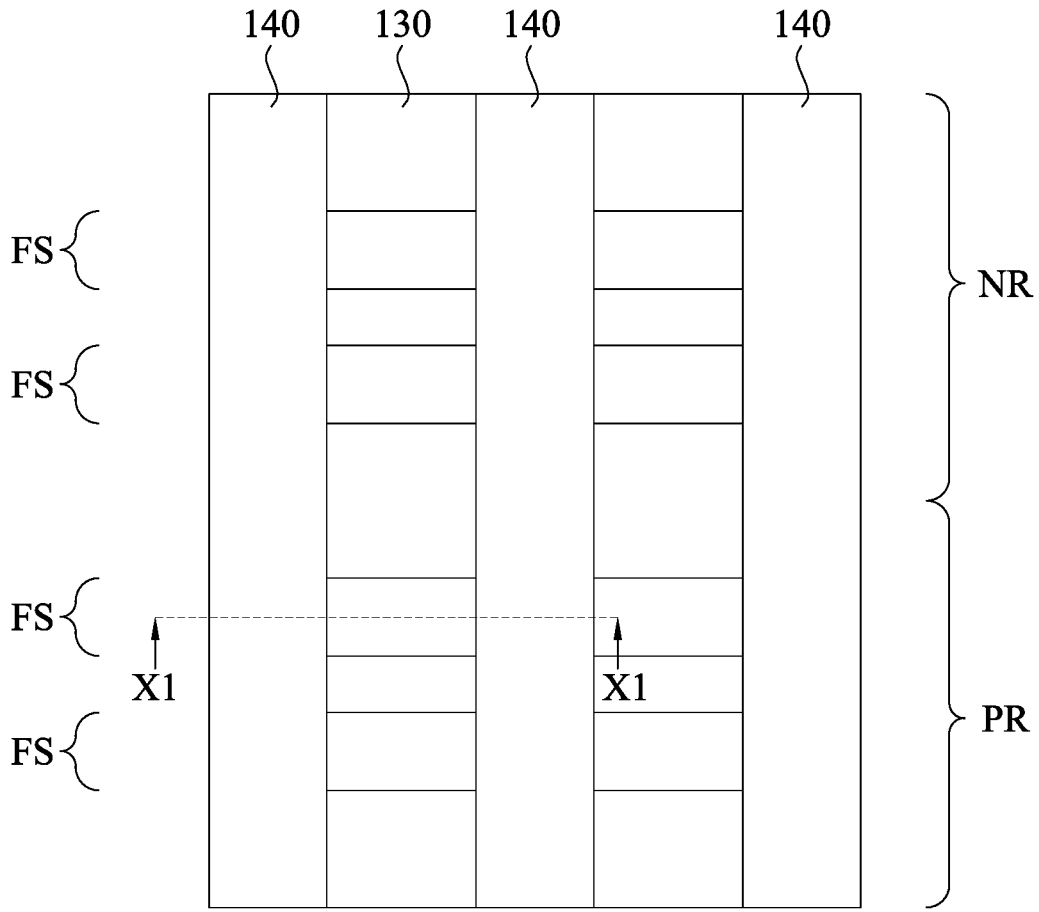
Figure 3A:
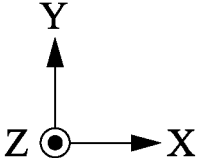
Figure 3B:
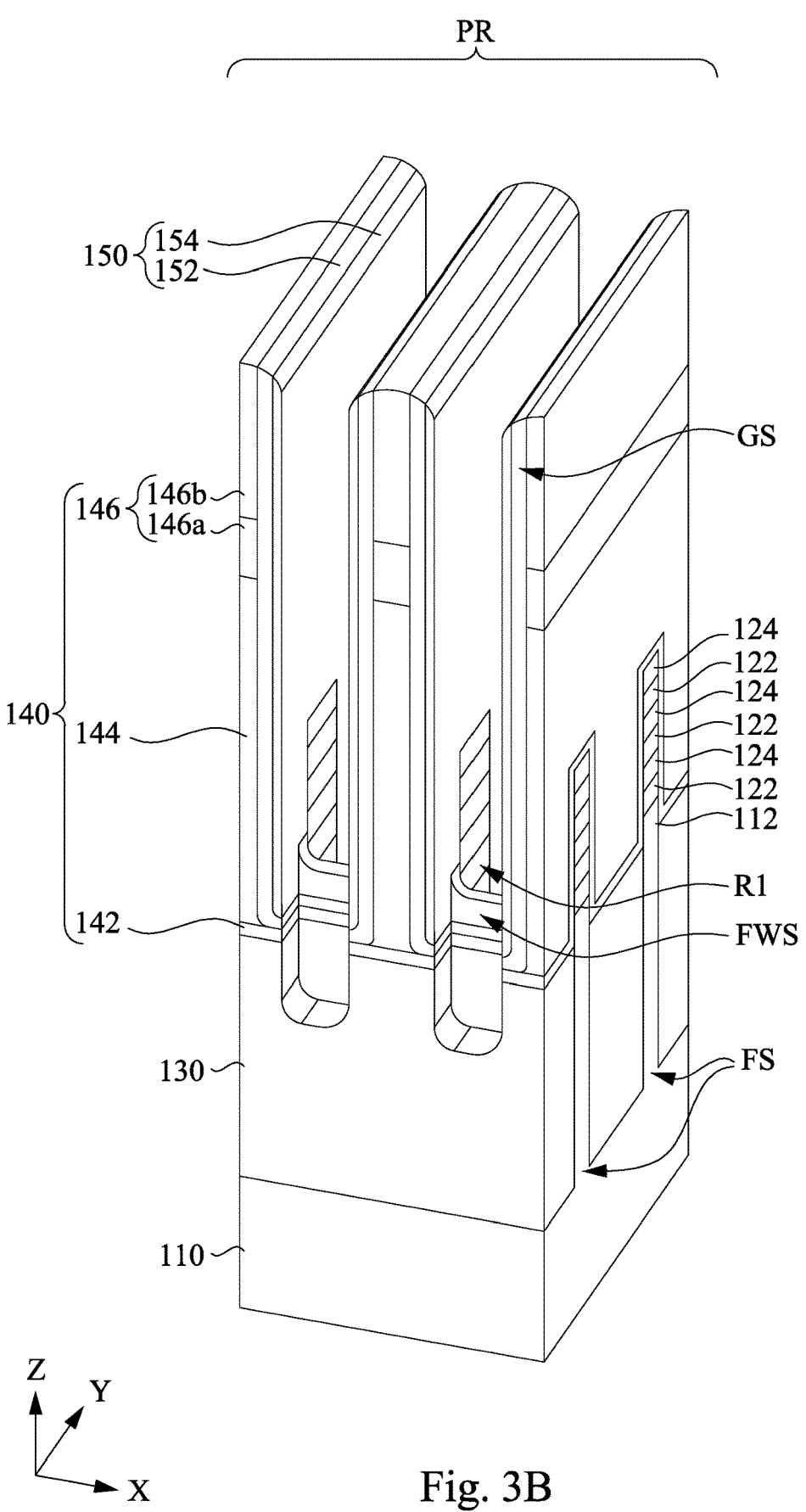
Figure 3C:
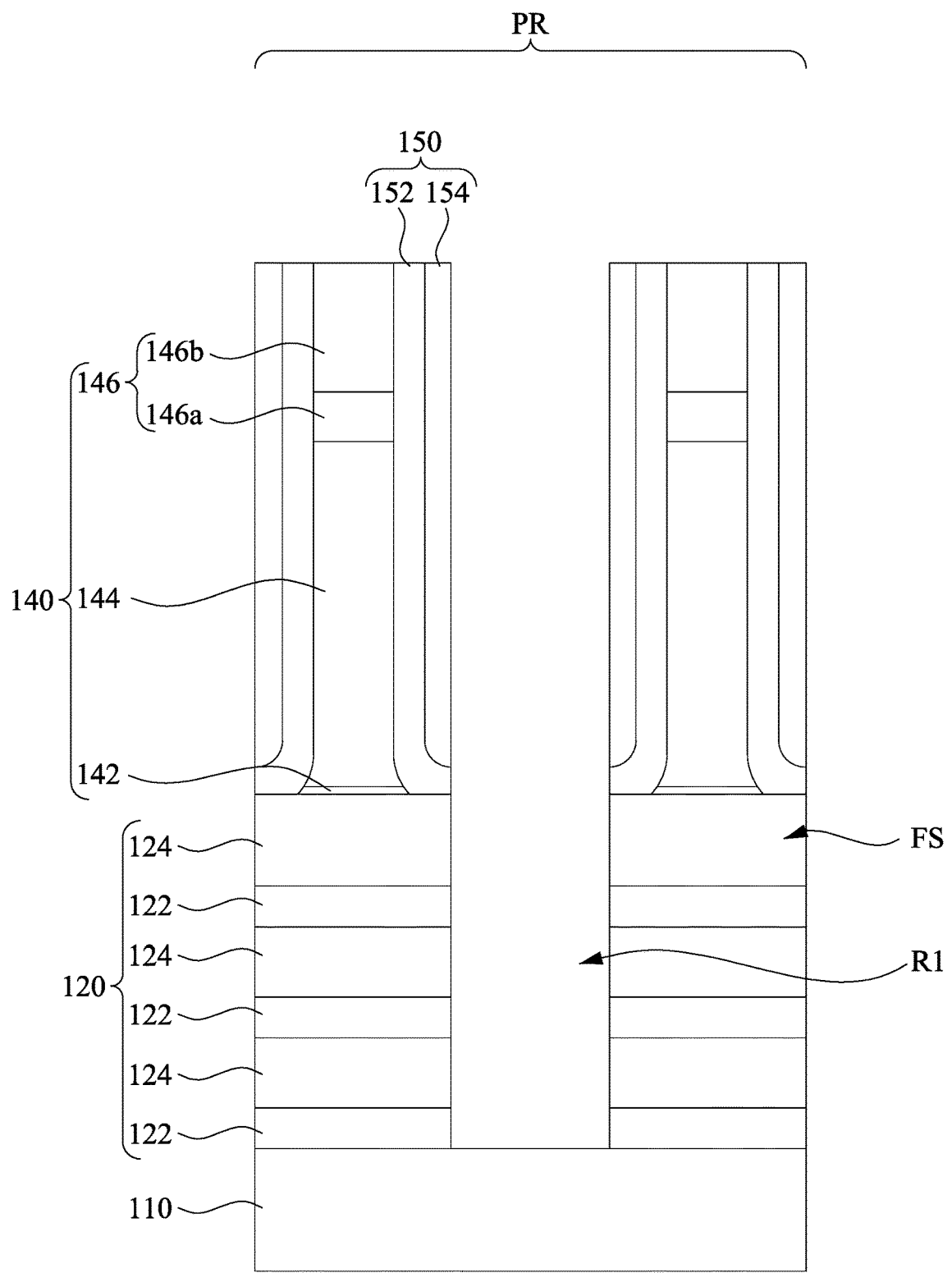

Reference is made to FIGS. 3A-3C. One or more dummy gate structures 140 are formed on the epitaxial stack 120. The dummy gate structure 140 may include a gate dielectric 142, a gate electrode 144, and a hard mask 146. The gate dielectric 142 may include one or more layers of dielectric material, such as silicon oxide, silicon nitride, a high-k dielectric material, and/or other suitable dielectric material. In some embodiments, the gate electrode 144 includes a material different than that of the gate dielectric 142. In some embodiments, the gate dielectric 142 may be deposited by a CVD process, a sub-atmospheric CVD (SACVD) process, a FCVD process, an ALD process, a PVD process, or other suitable process. The gate electrode 144 may include polycrystalline silicon (polysilicon). The hard mask 146 may include silicon oxide, silicon nitride, the like, or the combination thereof. In some embodiments, the materials of the dummy gate structures 140 are formed by various processes such as layer deposition, for example, CVD, PVD, ALD, thermal oxidation, or other suitable deposition techniques, or combinations thereof.

The dummy gate structures 140 may be formed by first depositing a blanket gate dielectric layer, a gate electrode layer, and a mask layer, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the dielectric layer, the gate electrode layer, and the mask layer, the fins FS are partially exposed on opposite sides of the dummy gate structure 140.

Gate spacers GS are formed on opposite sidewalls of the dummy gate structures 140, and fin sidewall spacers FWS are formed on opposite sidewalls of the fins FS. Formation of the gate spacers GS and the fin sidewall spacers FWS may include conformally depositing a spacer layer 150 on opposite sidewalls of the dummy gate structures 140 and on opposite sidewalls of the fins FS, followed by an etch back process. The spacer layer 150 may be made of a dielectric material such as silicon oxide, silicon nitride, silicon carbide, silicon oxynitride, SiCN, silicon oxycarbide, SiOCN, other low-k dielectric, the like, and/or combinations thereof. In some embodiments, the spacer layer 150 includes a single layer or multiple layers. For example, the spacer layer 150 include a first layer 152 and a second layer 154 over the first layer 152, in which the first and second layers 152 and 154 includes a same material or different materials. The spacer layer 150 may be conformally deposited by ALD or CVD processes. The spacer layer 150 is etched back to form gate spacers 162 or/and fin sidewall spacers 164. The etching back process may include an anisotropic dry etch process. During the anisotropic dry etch process, most of the one or more spacer material layers of the spacer layer 150 are removed from horizontal surfaces, such as the tops of the fins FS, leaving the gate spacers GS or/and the fin sidewall spacers FWS on the vertical surfaces, such as the sidewalls of the dummy gate structures 140 and sidewalls of the fins FS.

After formation of the dummy gate structures 140 and the gate spacers GS, exposed portions of the semiconductor fins FS that extend laterally beyond the gate spacers GS (e.g., in source/drain regions of the fins FS) are etched by using, for example, an anisotropic etching process that uses the dummy gate structures 140 and the gate spacers GS as an etch mask, resulting in recesses R1 into the semiconductor fins FS and between corresponding dummy gate structures 140. After the anisotropic etching, end surfaces of the sacrificial layers 122 and the channel layers 124 are exposed by the recesses R1 and aligned with respective outermost sidewalls of the gate spacers GS, due to the anisotropic etching. In some embodiments, the anisotropic etching may be performed by a dry chemical etch (e.g., reactive-ion etching) using suitable reaction gas, such as a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof. Through the etching process(es), top ends of the fin sidewall spacers FWS may be lowered to a position below tops of the fins FS. In some alternatively embodiments, the fin sidewall spacers FWS are entirely removed by etching the recesses R1.

Figure 4A:
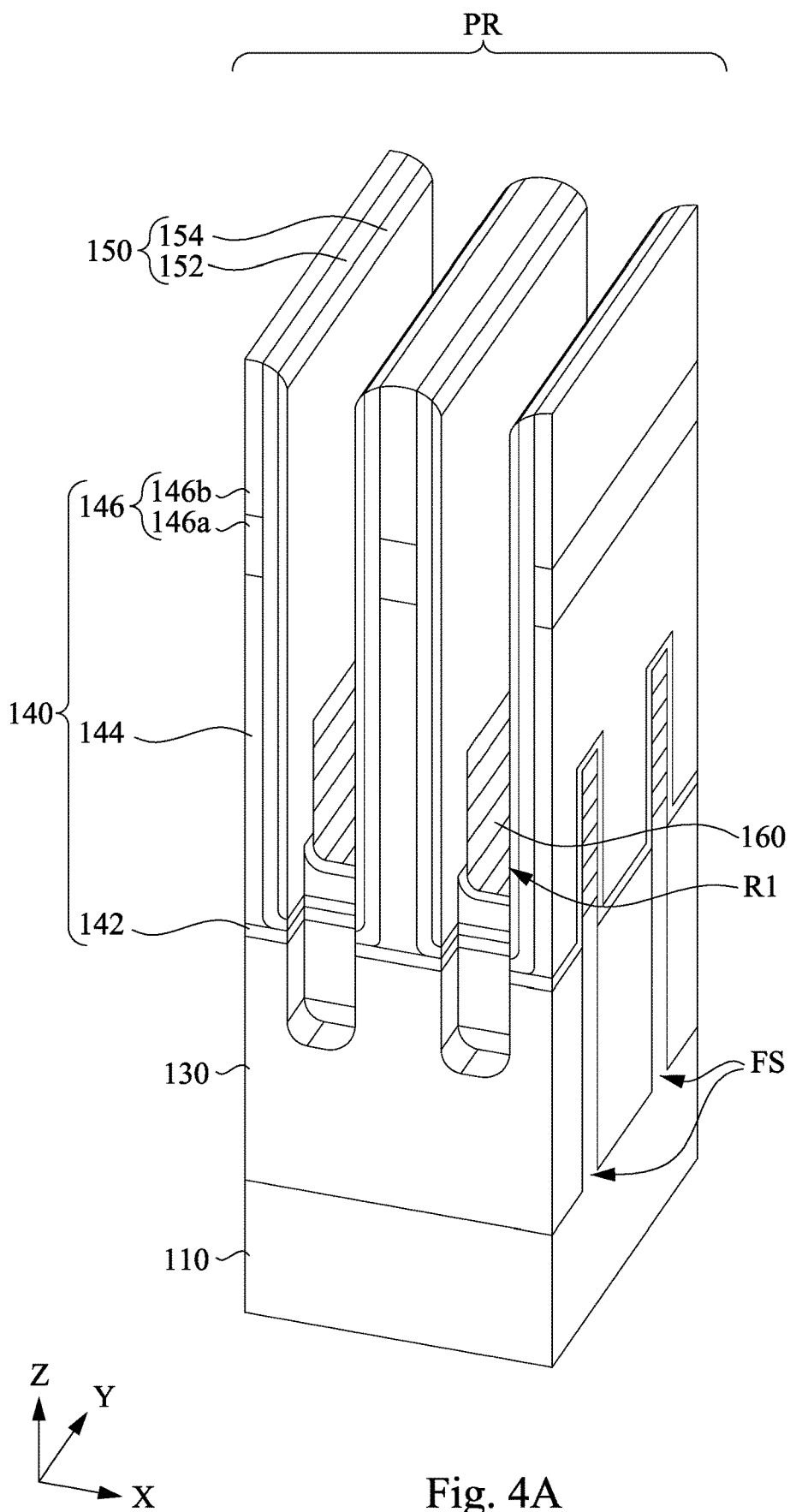
Figure 4B:
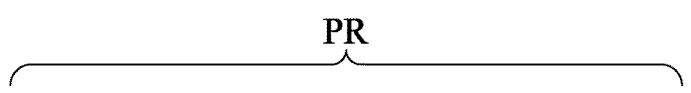

Reference is made to FIGS. 4A and 4B. The sacrificial layers 122 are laterally or horizontally recessed by using suitable selective etching process, resulting in lateral/sidewall recesses R2 vertically between corresponding channel layers 124, and vertically between the channel layer 124 and the substrate portion 112. For example, end surfaces of the sacrificial layers 122 are recessed by the selective etching process. The various compositions in epitaxial layers result in different oxidation rates and/or etch selectivity, thereby facilitating the selective etching process. In some embodiments, a selective dry etching process is performed by using fluoride-based etchant gas, such as $NF_3$, $SF_6$, the like, or the combination thereof. The fluoride-based gas may etch SiGe at a faster etch rate than it etches Si. The substrate portion 112 and the channel layers 124 may have a higher etch resistance to the selective etching process than that of the sacrificial layers 122. In some embodiments, the selective etching includes SiGe oxidation followed by a $SiGeO_x$ removal. For example, the oxidation may be provided by an oxygen-containing cleaning process and then $SiGeO_x$ removed by the fluoride-based plasma (e.g., $NF_3$ plasma) that selectively etches $SiGeO_x$ at a faster etch rate than it etches Si. Moreover, because oxidation rate of Si is much lower (sometimes 30 times lower) than oxidation rate of SiGe (or Ge), the channel layers 124 and the substrate portion 112 may not be significantly etched by the process of laterally recessing the sacrificial layers 122. As a result, the channel layers 124 and the substrate portion 112 laterally extend past opposite end surfaces of the sacrificial layers 122.

Inner spacers 160 are formed in the recesses R2. Stated differently, the inner spacers 160 may be formed on opposite end surfaces of the laterally recessed sacrificial layers 122. The inner spacers 160 may include a low-k dielectric material, such as SiOx, SiON, SiOC, SiN, SiCN, or SiOCN. Formation of the inner spacers 160 may include depositing an inner spacer material layer, followed by an anisotropic etching process to trim the deposited inner spacer material layer. Through the anisotropic etching process, only portions of the deposited inner spacer material layer that fill the lateral/sidewall recesses R2 are left. The inner spacers 160 may include a single layer or multiple layers. The inner spacers 160 may serve to isolate metal gates from source/drain regions formed in subsequent processing. In the example of FIGS. 4A and 4B, sidewalls of the inner spacers 160 are aligned with sidewalls of the channel layers 124.

Figure 5A:
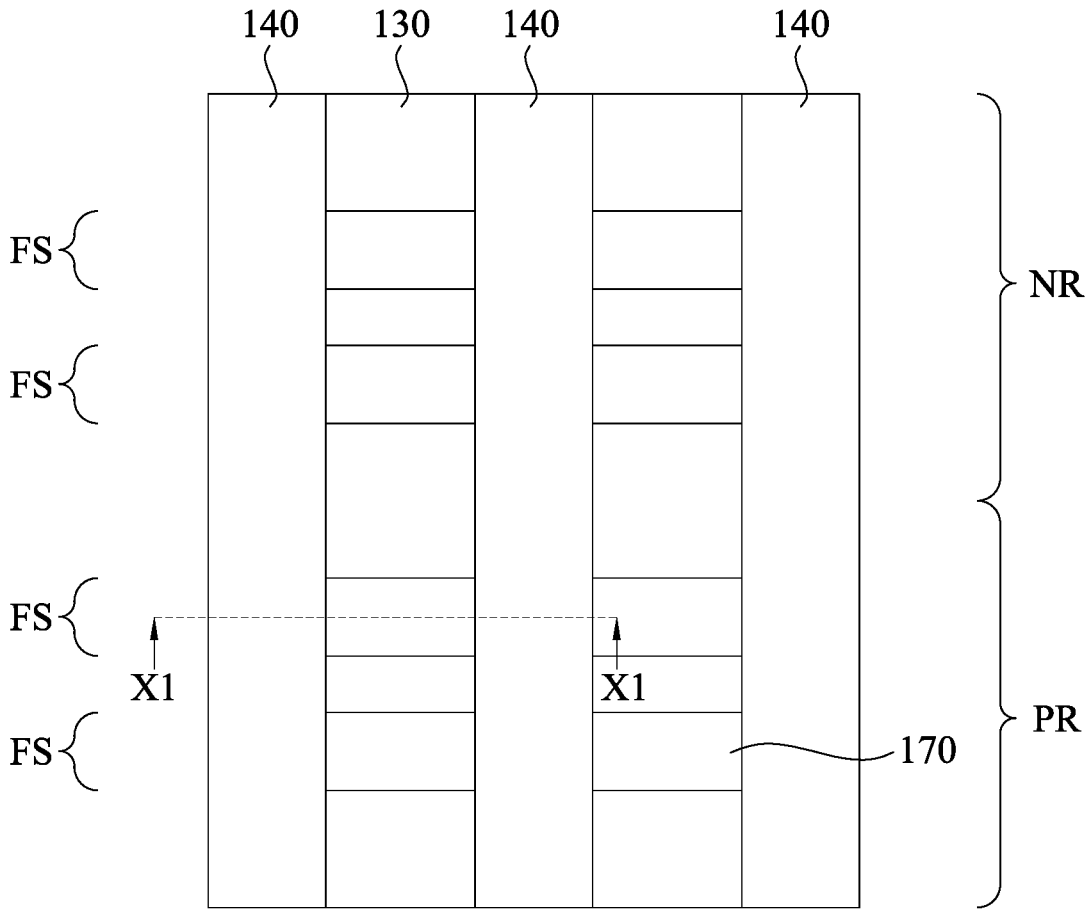
Figure 5A:
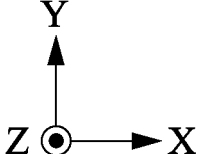
Figure 5B:
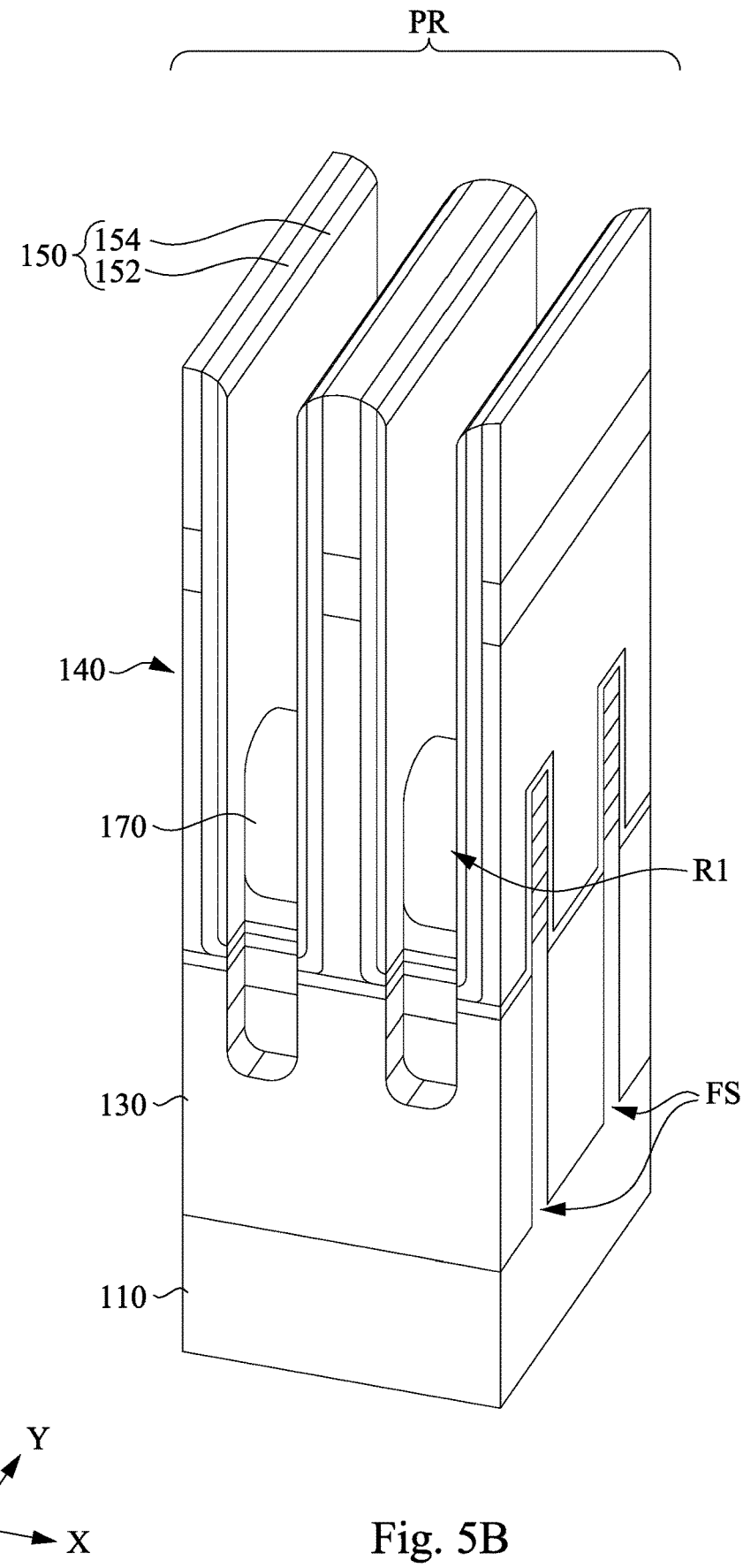
Figure 5C:

Reference is made to FIGS. 5A-5C. P-type source/drain epitaxial structures 170 are formed in the recesses R1 in the region PR. The formation of the p-type source/drain epitaxial structure 170 may be formed by performing an epitaxial growth process that provides an epitaxial material on the substrate 110 and/or the channel layer 124. During the epitaxial growth process, the gate spacers GS, fin sidewall spacers FWS, and the inner spacers 160 limit the p-type source/drain epitaxial structures 170 to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the substrate 110 and/or the channel layers 124.

In some embodiments, the p-type source/drain epitaxial structure 170 may include Ge, Si, GaAs, AlGaAs, SiGe, GaAsP, SiP, or other suitable material. The source/drain epitaxial structure 170 may be in-situ doped during the epitaxial process by introducing p-type doping species. In some embodiments, the p-type doping species include p-type dopants, such as boron or $BF_2$. For example, the p-type source/drain epitaxial structure 170 is SiGe: B. If the source/drain epitaxial structure 170 are not in-situ doped, an implantation process (i.e., a junction implant process) is performed to dope the source/drain epitaxial structure 170. The source/drain epitaxial structures 170 may have an initial dopant concentration greater than about $10^{18}$/cm$^3$. For example, the initial dopant concentration of the p-type source/drain epitaxial structure 170 may be in a range from 1E20 atoms/cm$^3$ to about 5E20 atoms/cm$^3$.

In some embodiments, prior to the epitaxial growth of the p-type source/drain epitaxial structure 170, a patterned mask may be formed to cover the n-type region NR and expose the p-type region PR, thereby preventing the n-type region NR from the materials of the p-type source/drain epitaxial structure 170 during the epitaxial growth of the p-type source/drain epitaxial structure 170. In some embodiments, the patterned mask may include a photoresist formed by a photolithography process. An exemplary photolithography process may include processing steps of photoresist coating, soft baking, mask aligning, exposing, post-exposure baking, developing photoresist and hard baking. In some embodiments, the patterned mask covering the n-type region NR and exposing the p-type region PR may further include a hard mask below the photoresist. For example, the hard mask may be made of a dielectric material such as silicon oxide, silicon nitride, silicon carbide, silicon oxynitride, SiCN, silicon oxycarbide, SiOCN, aluminum oxide, the like, and/or combinations thereof.

Figure 6A:
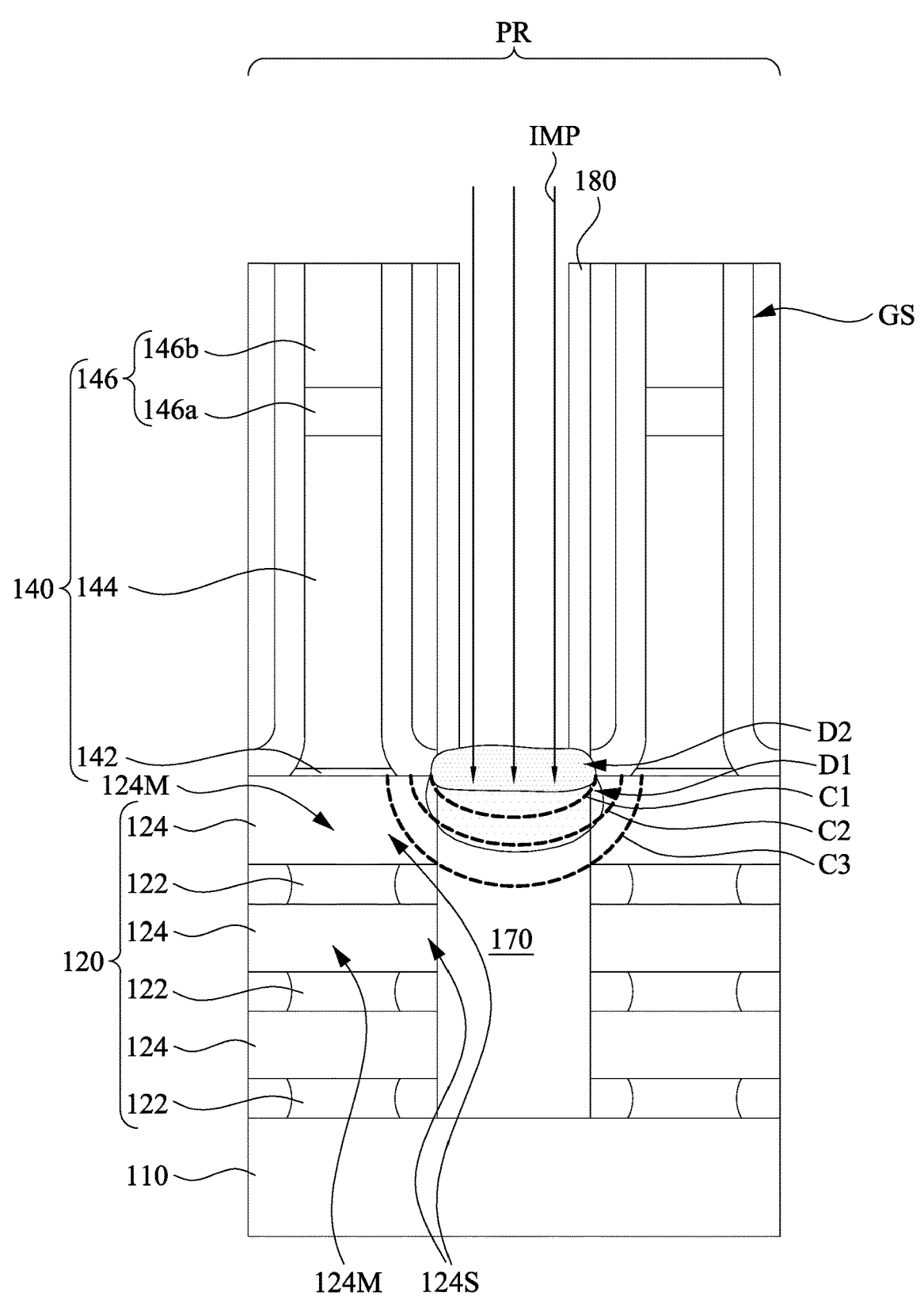

Reference is made to FIG. 6A. An ion implantation process IMP and an annealing process are performed to push the p-type doping species (e.g., boron) in the p-type source/drain epitaxial structure 170 into the topmost channel layer 124. The ion implantation process IMP may use suitable species, such as fluorine, carbon, silicon, germanium, the like, or the combination thereof. The ion implantation process IMP produce defects (e.g., vacancy or interstials) in top portions of the p-type source/drain epitaxial structure 170. For example, the ion implantation process IMP may knock the atoms in the p-type source/drain epitaxial structure 170 deeper, leaving behind a vacancy-rich region D1 near the surface of the p-type source/drain epitaxial structure 170. Excess interstitials produced from the ion implantation process IMP condense into form a interstitial-rich region D2 below the vacancy-rich region D1, which induces transient-enhanced diffusion (TED) of dopants, like boron. Thus, the junction of the p-type doping species in the p-type source/drain epitaxial structure 170 can be pushed into the channel layer 124, thereby reducing channel resistance. The vacancy-rich region D1 and the interstitial-rich region D2 can be referred to defect-rich regions, which may have a defect concentration higher than other portions of the p-type source/drain epitaxial structure 170 below the defect-rich regions (e.g., vacancy-rich region D1 and the interstitial-rich region D2). For example, the defect concentration in the vacancy-rich region D1 and the interstitial-rich region D2 may be greater than about 1E17 atoms/cm$^3$, such as from about 1E19 atoms/cm$^3$ to about 1E20 atoms/cm$^3$.

In some embodiments, a concentration of the implanted species (e.g., fluorine) in the p-type source/drain epitaxial structure 170 (e.g., in the regions D1 and D2) may be in a range from about 5E20 atoms/cm$^3$ to about 1E21 atoms/cm$^3$. The energy of the ion implantation process IMP may be in a range from about 1 keV to about 2 keV. The dosage of the ion implantation process IMP may be in a range from about 5E14 atoms/cm$^2$ to about 1E15 atoms/cm$^2$. If the concentration of the implanted species is less than about 5E20, the energy of the ion implantation process IMP is less than about 1 keV, or the dosage of the ion implantation process IMP is less than 5E14 atoms/cm², borons may not be pushed into the nanosheets to reduce channel length, and channel resistance may not be lowered. If the concentration of the implanted species is greater than about 1E21, the energy of the ion implantation process IMP is greater than about 2 keV, or the dosage of the ion implantation process IMP is greater than 1E15 atoms/cm², borons may be pushed into nanosheets too much, the subthreshold swing may become poor thereby degrading the device performance, and the fluorine loss in subsequently may undesirably decreases.

The angle of the ion implantation process IMP may be performed in a range from about 0 degree to about 15 degrees with respect to a direction normal to substrate surface. If the angle of the ion implantation process IMP is greater than about 15 degrees, the species may not be implanted into the source/drain epitaxial structure 170 effectively. The wafer may be rotated by angle from about 0 degree to about 360 degrees during the ion implantation process IMP. The temperature for the ion implantation process IMP may be in a range from about –40 Celsius degrees to about 450 Celsius degrees. If the temperature for the ion implantation process IMP is out of the range, the ion implantation process IMP may not effectively create the vacancy-rich region D1 and the interstitial-rich region D2 in the source/drain epitaxial structure 170.

In some embodiments, the ion implantation process IMP is performed to form the interstitial-rich region D2 by a distance below the surface of the p-type source/drain epitaxial structure 170, in which the distance may be in a range from about 10 nanometers to about 20 nanometers. If the distance is less than about 10 nanometers, borons may not be pushed into the nanosheets to reduce channel length, and channel resistance may not be lowered. If the distance is greater than about 20 nanometers, borons may be pushed into nanosheets too much, the subthreshold swing may become poor, and the device performance may degrade.

During the ion implantation process IMP, each implanted ion traverses a random path as it penetrates the target, losing energy by nuclear and electronic stopping. Ion trajectories can be predicted employing statistical means. The average depth of the implanted ions is called the projected range. The projected range may be designed such that a position below a top surface of the source/drain epitaxial structure by the projected range is higher than a bottom surface of the topmost one of the channel layers and lower than a top surface of the topmost one of the channel layers. In some further embodiments, a position below a top surface of the source/drain epitaxial structure by the projected range is aligned with a middle region of the topmost one of the channel layers (e.g., a region from a level at one-fourth of a height of the topmost one of the channel layers to a level at three-fourth of the height of the topmost one of the channel layers). For example, a projected range of the ion implantation process IMP may be in a range from about 5 nanometers to about 10 nanometers. If the projected range of the ion implantation process IMP is less than about 5 nanometers or half of the thickness of the channel layer 124, borons may not be pushed into the nanosheets to reduce channel length, and channel resistance may not be lowered. If the projected range of the ion implantation process IMP is greater than about 10 nanometers or twice the thickness of the channel layer 124, borons may be pushed into nanosheets too much, the subthreshold swing may become poor, and the device performance may degrade.

In some embodiments, prior to the ion implantation process IMP, a protection layer 180 is formed adjoining the gate spacer GS. The protection layer 180 is also formed to cover the n-type region NR, thereby preventing the n-type region NR from the ion implantation process IMP. The protection layer 180 may be a metal-containing compound layer, such as AlO$_x$. Formation of the protection layer 180 may include depositing a metal-containing compound film over the p-type region PR and the n-type region NR, and patterning the metal-containing compound film to exposing the p-type source/drain epitaxial structure 170 in the p-type region PR. The patterning process may include forming a photomask by a lithography process, and etching that a horizontal portion of the metal-containing compound film uncovered by the photomask.

Right after the ion implantation process IMP, a first annealing process may be performed to induce trigger TED of dopants, like boron. The first annealing process can also reduce the species of the ion implantation process IMP (e.g., fluorine) in the p-type source/drain epitaxial structure 170. The first annealing process may be a flash lamp annealing (FLA) process, a laser spike annealing (LSA) process, a rapid thermal annealing (RTA) process, the like, or the combination thereof.

The FLA or the LSA process may be performed at a temperature from about 1050 Celcius degrees to about 1200 Celcius degrees with a dwell time ranging from about 0.1 millisecond to about 40 milliseconds. If the temperature is higher than about 1200 Celcius or the dwell time is greater than about 40 milliseconds, the subthreshold swing may become poor, borons may be pushed into nanosheets too much, and the device performance may degrade. If the temperature is lower than about 1050 Celcius or the dwell time is less than about 0.1 milliseconds, borons may not be pushed into the nanosheets to reduce channel length, and channel resistance may not be lowered.

The RTA process may be performed at a temperature from about 900 Celcius degrees to about 1000 Celcius degrees with a dwell time ranging from about 1 second to about 10 seconds. If the temperature is higher than about 1200 Celcius or the dwell time is greater than about 40 milliseconds, the subthreshold swing may become poor, borons may be pushed into nanosheets too much, and the device performance may degrade. If the temperature is lower than about 1050 Celcius or the dwell time is less than about 0.1 milliseconds, borons may not be pushed into the nanosheets to reduce channel length, and channel resistance may not be lowered. The chamber pressure may range from about 1 torr to about 760 torr. If the chamber pressure is out of the range, the first annealing process may not effectively induce diffusion of the p-type doping species (e.g., boron) in p-type source/drain epitaxial structure 170.

Figure 6B:
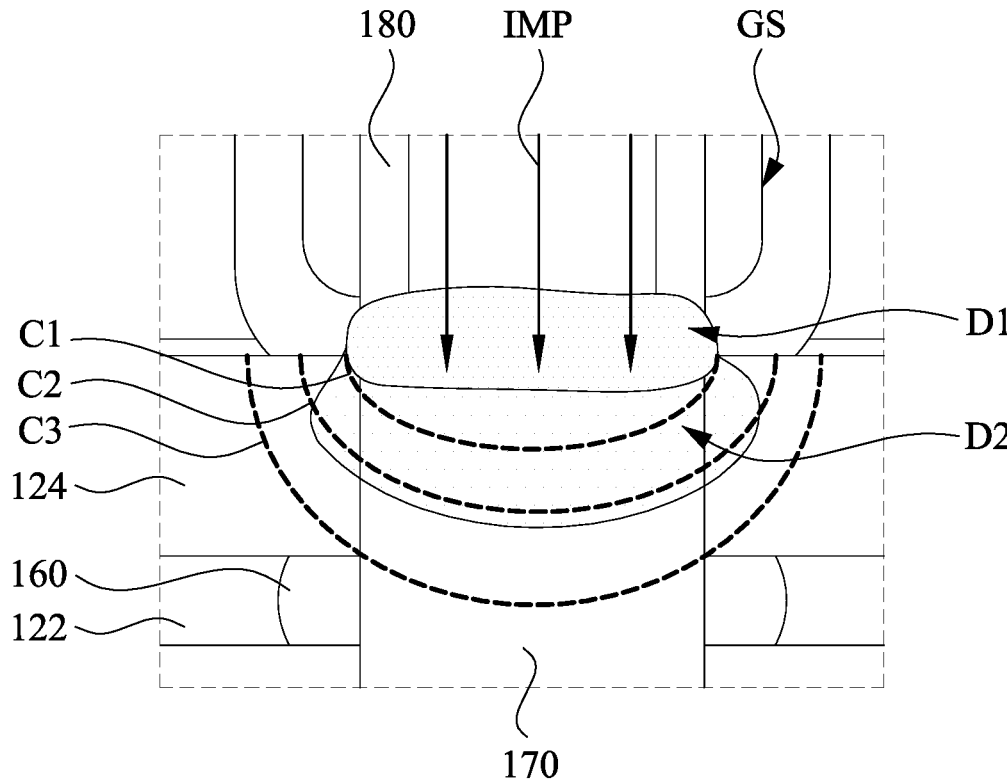

FIG. 6B is an enlarged view of FIG. 6A. Dashed lines C1-C2 respectively indicate a first increase, a second increase, and a third increase of concentrations of the p-type doping species caused by the ion implantation process IMP and the first annealing process, in which the first increase at the dashed line C1 is greater than the second increase at the dashed line C2, and the second increase at the dashed line C2 is greater than the third increase at the dashed line C3. For example, in some embodiments where the p-type doping species is boron, the first increase at the dashed line C1 may be in a range from 3E20 atoms/cm³ to about 7E20 atoms/cm³ (e.g., about 5E20 atoms/cm³), the second increase at the dashed line C2 may be in a range from 8E19 atoms/cm³ to about 2E20 atoms/cm³ (e.g., about 1E20 atoms/cm³), and the third increase at the dashed line C3 may be in a range from 8E18 atoms/cm$^3$ to about 3E19 atoms/cm$^3$ (e.g., about 1E19 atoms/cm$^3$). Depending on process conditions and device requirement, the first to third increase at the dashed lines C$_1$-C$_3$ may be any suitable values. Dashed lines C1-C2 may indicate a profile of the junction of the p-type doping species in the p-type source/drain epitaxial structure 170 and the channel layer 124.

In some embodiments, as the p-type source/drain epitaxial structure 170 has been doped with p-type dopants with the initial dopant concentration (e.g., ranging from 1E20 atoms/cm$^3$ to about 5E20 atoms/cm$^3$), inside the p-type source/drain epitaxial structure 170 (e.g., SiGe), the actual concentration of the p-type doping species (e.g., boron) at the dashed line C1 may be a sum of the initial dopant concentration and the first increase, the actual concentration of the p-type doping species (e.g., boron) at the dashed line C2 may be a sum of the initial dopant concentration and the second increase, and the actual concentration of the p-type doping species (e.g., boron) at the dashed line C3 may be a sum of the initial dopant concentration and the third increase. And, the actual concentrations inside the p-type source/drain epitaxial structure 170 also decrease from the dashed line C1 to the dashed line C3.

In some embodiments, as the semiconductor layer 124 are intrinsic semiconductor layers, the actual concentration of the p-type doping species (e.g., boron) at the dashed lines C2 and C3 inside the semiconductor layers 124 (e.g., Si) may be substantially equal to the first to third increase amount. In the present embodiments, the dashed lines C2 and C3 extend into the topmost semiconductor layer 124, while the dash line C1 does not C3 extend into the topmost semiconductor layer 124. For example, inside the topmost semiconductor layers 124 (e.g., Si), the actual concentration of the p-type doping species (e.g., boron) at the dashed line C2 may be in a range from 8E19 atoms/cm$^3$ to about 2E20 atoms/cm$^3$ (e.g., about 1E20 atoms/cm$^3$). And, inside the topmost semiconductor layers 124 (e.g., Si), the actual concentration of the p-type doping species (e.g., boron) at the dashed line C3 may be in a range from 8E18 atoms/cm$^3$ to about 3E19 atoms/cm$^3$ (e.g., about 1E19 atoms/cm$^3$). That is, side portions 124S of the topmost semiconductor layer 124 may have a boron concentration greater than about 1E19 atoms/cm$^3$, thereby reducing a length of channel region in the topmost semiconductor layer 124. Stated differently, side portions 124S of the topmost semiconductor layer 124 may serve as an extending portion of boron junction in source/drain region, leaving the middle portion 124M of the topmost semiconductor layer 124 having a boron concentration much lower than about 1E19 atoms/cm$^3$ can serve as channel region in the topmost semiconductor layer 124. For example, the side portions 124S of the topmost semiconductor layer 124 with boron concentration greater than about 1E19 atoms/cm$^3$ (or greater than about 1E20 atoms/cm$^3$) may locate directly below the gate spacer and the gate structure. In some embodiments, the side portions 124S of the topmost semiconductor layer 124 with boron concentration greater than about 1E20 atoms/cm$^3$ (or greater than about 1E20 atoms/cm$^3$) may locate directly below the gate spacer, but not directly below the gate structure.

In some alternative embodiments, the dashed lines C$_1$-C$_3$ can extend into the topmost semiconductor layer 124. And, in such embodiments, inside the topmost semiconductor layers 124 (e.g., Si), the actual concentration of the p-type doping species (e.g., boron) at the dashed line C1 may be in a range from 3E20 atoms/cm$^3$ to about 7E20 atoms/cm$^3$ (e.g., about 5E20 atoms/cm$^3$). And, the actual concentrations inside the topmost semiconductor layers 124 also decrease from the dashed line C1 to the dashed line C3.

Figure 7:

In some embodiments, the dashed lines C$_1$-C$_3$ may not extend into the second topmost semiconductor layer 124. Thus, the concentration of the p-type doping species (e.g., boron) in a side portion 124S of the topmost semiconductor layer 124 is greater than a concentration of the p-type doping species (e.g., boron) in a side portion 124S of the second topmost semiconductor layer 124. After the ion implantation process IMP and the first annealing process, a wet clean/etch process can be performed to remove the protection layer 180 from the gate spacer GS. The resulted structure is shown in FIG. 7.

Figure 8A:
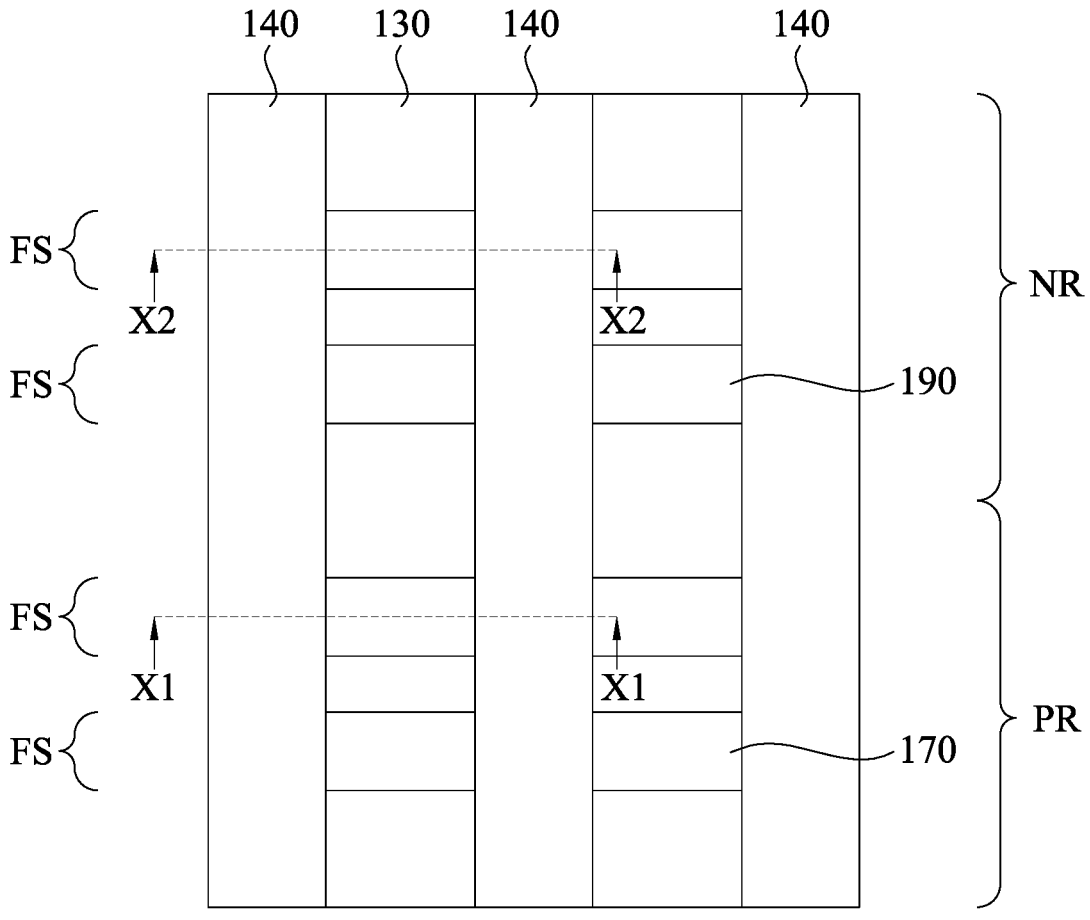
Figure 8A:
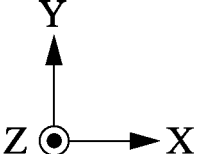
Figure 8B:
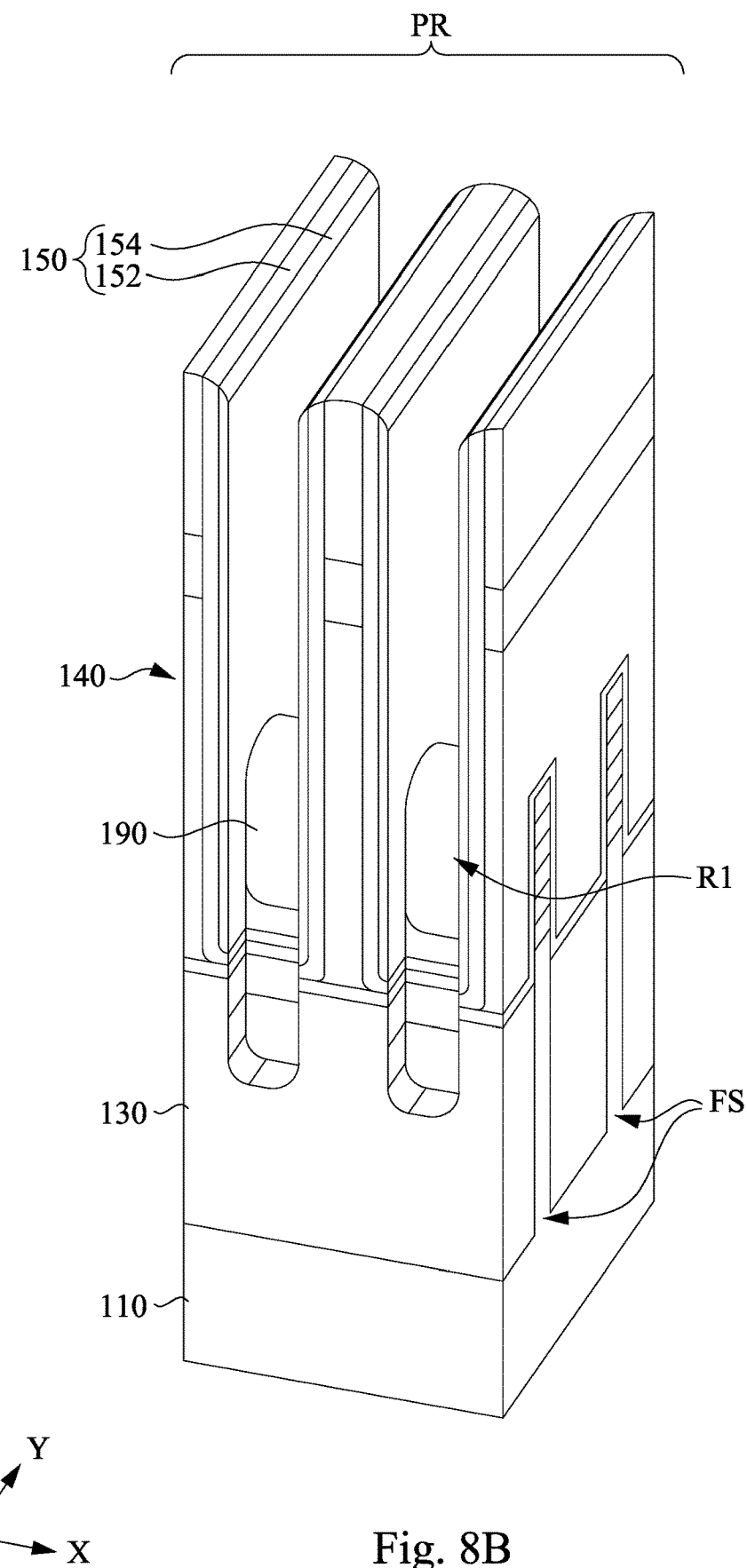
Figure 8C:
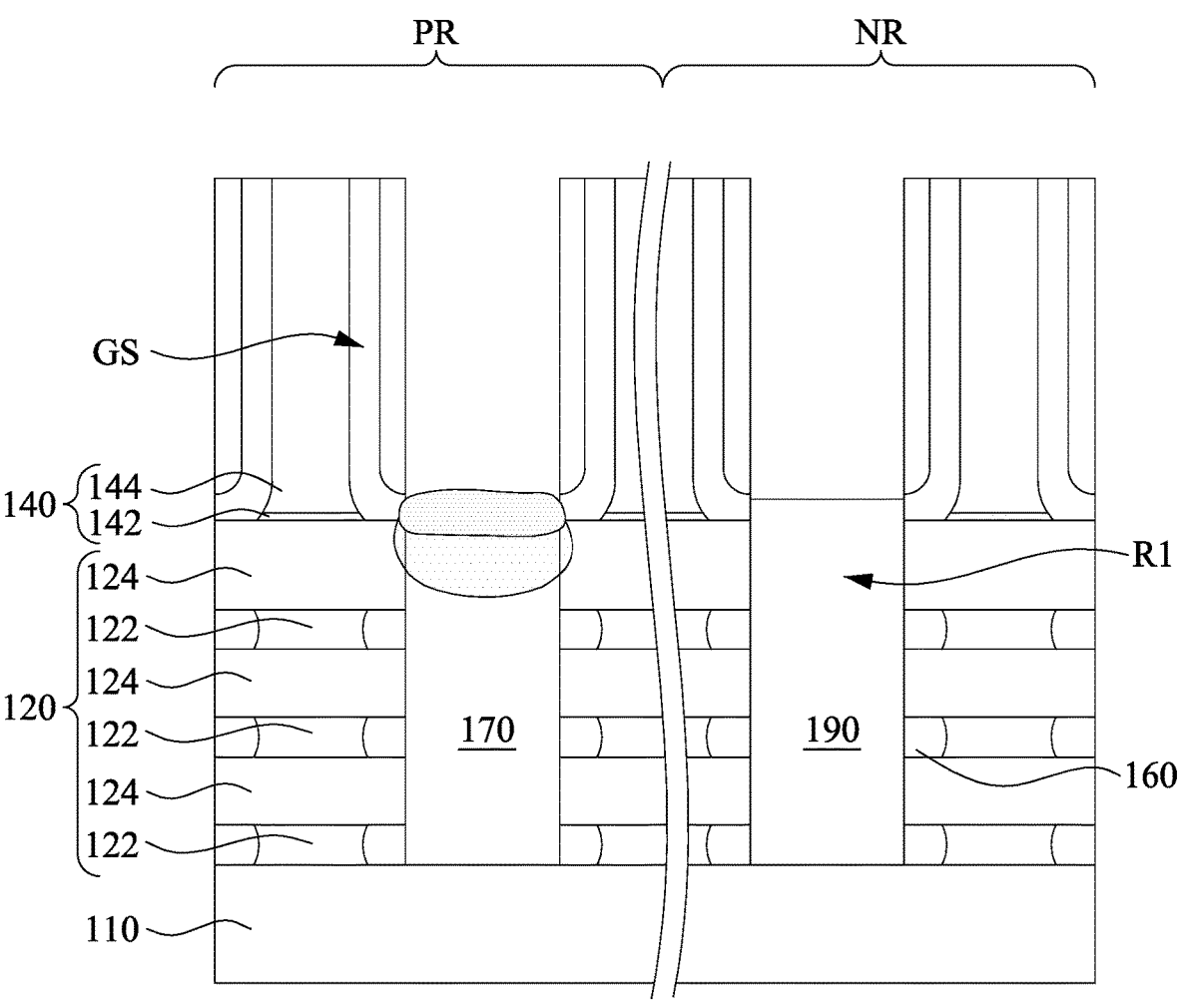

Reference is made to FIGS. 8A-8C. N-type source/drain epitaxial structures 190 are formed in the recesses R1 in the region NR. The formation of the n-type source/drain epitaxial structure 190 may be formed by performing an epitaxial growth process that provides an epitaxial material on the substrate 110 and/or the semiconductor layer 124. During the epitaxial growth process, the gate spacers GS, fin sidewall spacers FWS, and the inner spacers 160 limit the n-type source/drain epitaxial structures 190 to the source/drain regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the substrate 110 and/or the semiconductor layers 124.

In some embodiments, the n-type source/drain epitaxial structure 190 may include Ge, Si, GaAs, AlGaAs, SiGe, GaAsP, SiP, or other suitable material. The n-type source/drain epitaxial structure 190 may be in-situ doped during the epitaxial process by introducing n-type doping species. In some embodiments, the n-type doping species include n-type dopants, such as phosphorus or arsenic. If the source/drain epitaxial structure 190 are not in-situ doped, an implantation process (i.e., a junction implant process) is performed to dope the source/drain epitaxial structure 190. The source/drain epitaxial structures 190 may have dopant concentration greater than about 10$^{18}$/cm$^3$.

In some embodiments, prior to the epitaxial growth of the n-type source/drain epitaxial structure 190, a patterned mask may be formed to cover the p-type region PR and expose the n-type region NR, thereby preventing the p-type region PR from the materials of the n-type source/drain epitaxial structure 190 during the epitaxial growth of the n-type source/drain epitaxial structure 190. In some embodiments, the patterned mask may include a photoresist formed by a photolithography process. An exemplary photolithography process may include processing steps of photoresist coating, soft baking, mask aligning, exposing, post-exposure baking, developing photoresist and hard baking. In some embodiments, the patterned mask covering the p-type region PR and exposing the n-type region NR may further include a hard mask below the photoresist. For example, the hard mask may be made of a dielectric material such as silicon oxide, silicon nitride, silicon carbide, silicon oxynitride, SiCN, silicon oxycarbide, SiOCN, aluminum oxide, the like, and/or combinations thereof.

After the formation of the n-type source/drain epitaxial structure 190, a second annealing process may be performed to activate dopants in the p-type source/drain epitaxial structure 170 and the n-type source/drain epitaxial structure 190. The second annealing process may be performed at a temperature greater than that of the first annealing process right after the ion implantation process IMP. For example, the second annealing process may be may be performed at a temperature from about 1100 Celcius degrees to about 1400 Celcius degrees. Both the first and second annealing processes may recover defects in the p-type source/drain epitaxial structure 170 and the n-type source/drain epitaxial structure 190. For example, the defect concentration in the vacancy-rich region D1 and the interstitial-rich region D2 may be degraded.

Figure 9A:
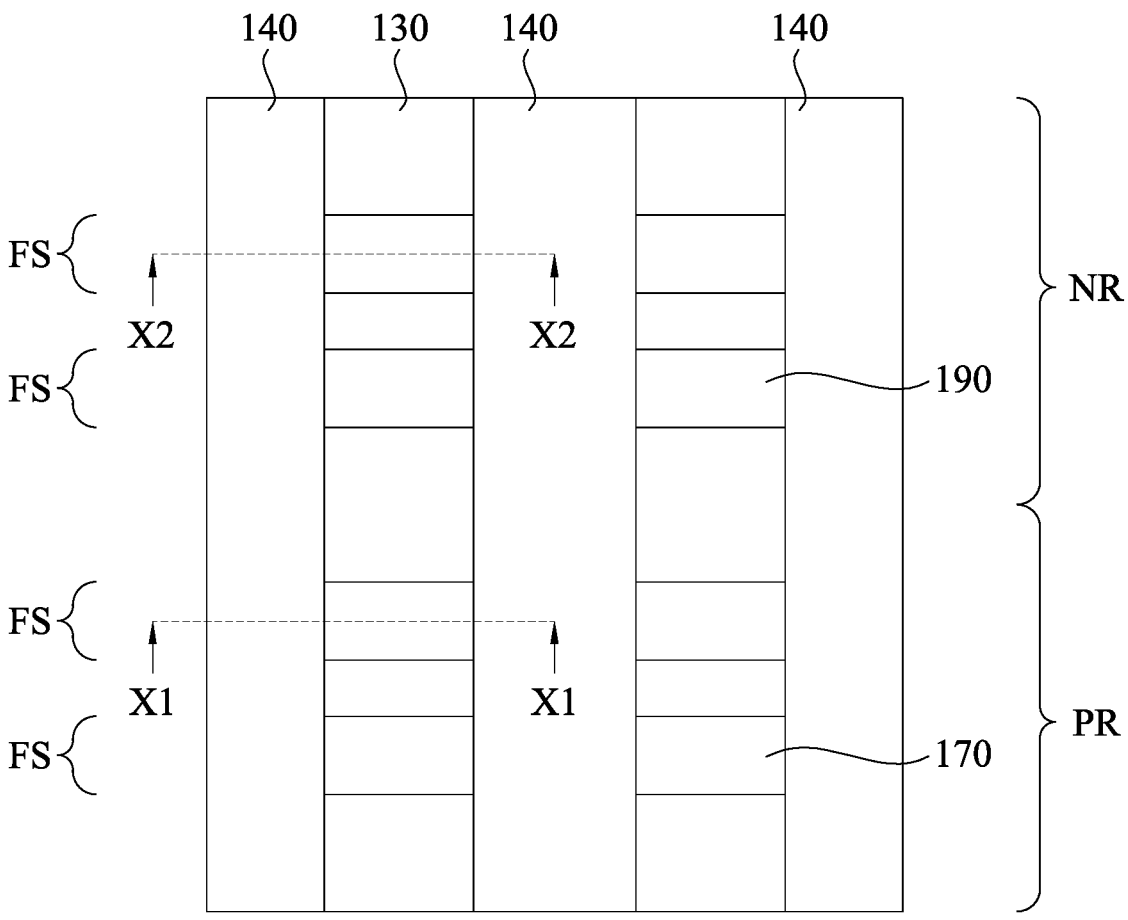
Figure 9B:
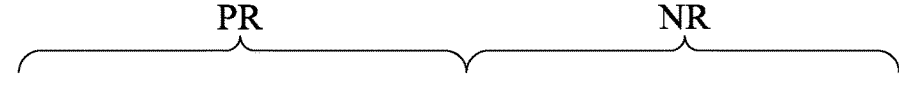
Figure 9B:
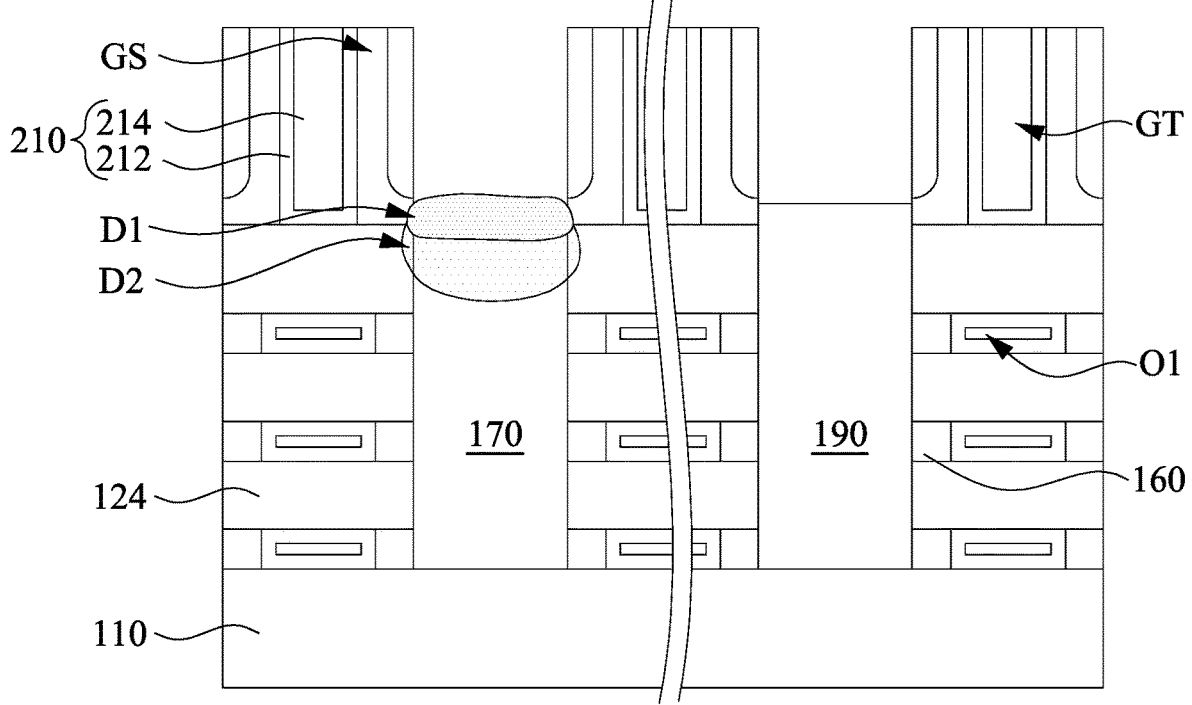

Reference is made to FIGS. 9A-9B. An interlayer dielectric (ILD) layer 200 is formed over the structure of FIGS. 8A-8C and filling the space between the dummy gate structures 140. The ILD layer 200 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 200 may be deposited by a PECVD process or other suitable deposition technique. In some embodiments, after formation of the ILD layer 200, the semiconductor device may be subject to a high thermal budget process to anneal the ILD layer 200. After depositing the ILD layer 200, a planarization process may be performed to remove excessive materials of the ILD layer 200. For example, a planarization process includes a chemical mechanical planarization (CMP) process which removes portions of the ILD layer 200 overlying the dummy gate structures 140 and planarizes a top surface of the semiconductor device. The planarization process may also remove the hard mask 146 of the dummy gate structures 140 (referring to FIGS. 8A-8C) to expose the underlying dummy gate electrode 144.

A gate replacement process is performed. The dummy gate structures 140 and the sacrificial layers 122 (referring to FIGS. 8B and 8C) are replaced with high-k/metal gate structures 210. The dummy gate structures 140 including gate electrode 144 and the gate dielectric 142 (referring to FIGS. 8B and 8C) are removed, followed by removing the sacrificial layers 122 (referring to FIGS. 8B and 8C). In the illustrated embodiments, the dummy gate structures 140 (referring to FIGS. 8B and 8C) are removed by using a selective etching process (e.g., selective dry etching, selective wet etching, or a combination thereof) that etches the materials in dummy gate structures 140 (referring to FIGS. 8B and 8C) at a faster etch rate than it etches other materials (e.g., gate spacers GS and/or the ILD layer 200), thus resulting in gate trenches GT between corresponding gate spacers GS, with the sacrificial layers 122 (referring to FIGS. 8B and 8C) exposed in the gate trenches GT. Subsequently, the sacrificial layers 122 (referring to FIGS. 8B and 8C) in the gate trenches GT are etched by using another selective etching process that etches the sacrificial layers 122 at a faster etch rate than it etches the channel layers 124, thus forming openings/spaces O1 between neighboring channel layers 124. The openings/spaces O1 may expose the sidewalls of the inner spacers 160. In this way, the channel layers 124 become nanosheets suspended over the substrate 110 and between the source/drain epitaxial structures 170/190. According to the pattern of fins FS (referring to FIG. 8A), plural subsects of channel layers 124 (denoted as nanosheet subsets NS) remain over the substrate 110. This step is also called a channel release process. At this interim processing step, the openings/spaces O1 between nanosheets 124 may be filled with ambient environment conditions (e.g., air, nitrogen, etc).

In some embodiments, the sacrificial layers 122 (referring to FIGS. 8B and 8C) are removed by using a selective dry etching process. In some embodiments, the sacrificial layers 122 (referring to FIGS. 8B and 8C) are SiGe and the channel layers 124 are silicon allowing for the selective removal of the sacrificial layers 122 (referring to FIGS. 8B and 8C). In some embodiments, the selective dry etching may use chloride-based gases, such as $CF_4$, $C_4F_8$, the like, or the combination thereof. In some embodiments, the selective removal includes SiGe oxidation followed by a $SiGeO_x$ removal. For example, the oxidation may be provided by $O_2$ plasma and then $SiGeO_x$ removed by the chloride-based plasma (e.g., $CF_4/C_4F_8$ plasma) that selectively etches $SiGeO_x$ at a faster etch rate than it etches Si, and stops on SiGe. The steps of SiGe oxidation and $SiGeO_x$ removal may be repeated until the sacrificial layers 122 are fully removed.

Replacement gate structures 210 are respectively formed in the gate trenches GT to surround each of the nanosheets 124 suspended in the gate trenches GT. The gate structures 210 may be final gates of GAA FETs. The final gate structure may be a high-k/metal gate stack, however other compositions are possible. In some embodiments, each of the gate structures 210 forms the gate associated with the multi-channels provided by the plurality of nanosheets 124. For example, the high-k/metal gate structures 210 are formed within the openings/spaces O1 provided by the release of nanosheets 124. The high-k/metal gate structures 210 may be between the nanosheets 124 and surrounded by the inner spacers 160.

In various embodiments, the high-k/metal gate structures 210 includes a gate dielectric layer 212 formed around the nanosheets 124 and a gate metal layer 214 formed around the gate dielectric layer 212 and filling a remainder of gate trenches GT. Formation of the high-k/metal gate structures 210 may include one or more deposition processes to form various gate materials, followed by a CMP process to remove excessive gate materials, resulting in the high-k/metal gate structures 210 having top surfaces level with a top surface of the ILD layer 200. Thus, transistors (e.g., GAA FET) are formed, and the high-k/metal gate structures 210 surrounds each of the nanosheets 124, and thus is referred to as a gate of the transistors (e.g., GAA FET).

The gate dielectric layer 212 may include an interfacial layer and a high-k gate dielectric layer over the interfacial layer. In some embodiments, the interfacial layer is silicon oxide formed on exposed surfaces of semiconductor materials in the gate trenches GT by using, for example, thermal oxidation, chemical oxidation, wet oxidation or the like. As a result, surface portions of the nanosheets 124 and the substrate 110 exposed in the gate trenches GT are oxidized into silicon oxide to form interfacial layer. In some embodiments, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 214 includes one or more metal layers. For example, the gate metal layer 214 may include one or more work function metal layers stacked one over another. The one or more work function metal layers in the gate metal layer 214 provide a suitable work function for the high-k/metal gate structures 210 according to the conductivity types of the devices.

In some embodiments, the gate metal layer 214 in the p-type region PR may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the gate metal layer 214 in the n-type region NR may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, titanium nitride (TiN), tungsten (W), and/or other suitable materials. In some embodiments, the gate metal layers 264 may include the same work function metal layers for n-type devices and p-type devices. In some embodiments, the gate metal layers 264 may include different work function metal layers for n-type devices and p-type devices.

In some embodiments, the work function metal layer(s) may fill the gate trenches GT. In some alternative embodiments, the gate metal layer 214 may also include and a fill metal over the work function metal layer(s) and filling up a remainder of the gate trenches GT. In some embodiments, the fill metal in the gate metal layer 214 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 10:
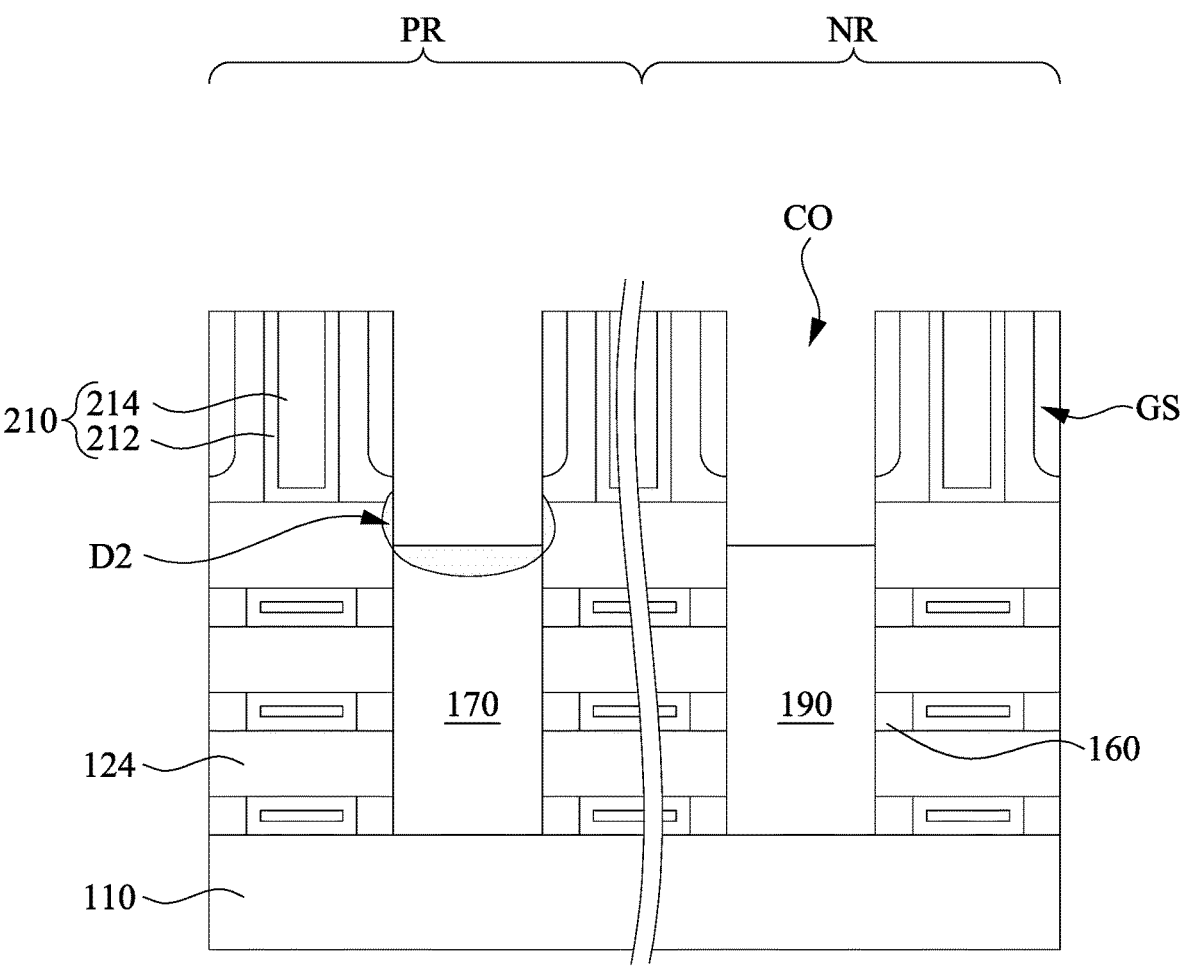

Reference is made to FIG. 10. Source/drain contact openings CO are etched in the ILD layer 200 to expose top surfaces of the source/drain epitaxial structures 170 and 190. In some embodiments, etching the source/drain contact openings CO may consume top portions of the source/drain epitaxial structures 170 and 190. As illustrated in FIG. 10, an entirety of the vacancy-rich region D1 of the source/drain epitaxial structure 170 and a top portion of the interstitial-rich region D2 of the source/drain epitaxial structure 170 (referring to FIG. 9B) are consumed by etching the source/drain contact openings CO. Thus, a bottom portion of the interstitial-rich region D2 remains and exposed by the source/drain contact openings CO. In some alternative embodiments, a top portion of the vacancy-rich region D1 of the source/drain epitaxial structure 170 (referring to FIG. 9B) is consumed by etching the source/drain contact openings CO, while a bottom portion of the vacancy-rich region D1 of the source/drain epitaxial structure 170 (referring to FIG. 9B) remains and exposed by the source/drain contact openings CO. In some alternative embodiments, an entirety of the vacancy-rich region D1 and an entirety of the interstitial-rich region D2 of the source/drain epitaxial structure 170 are consumed by etching the source/drain contact openings CO.

Figure 11:
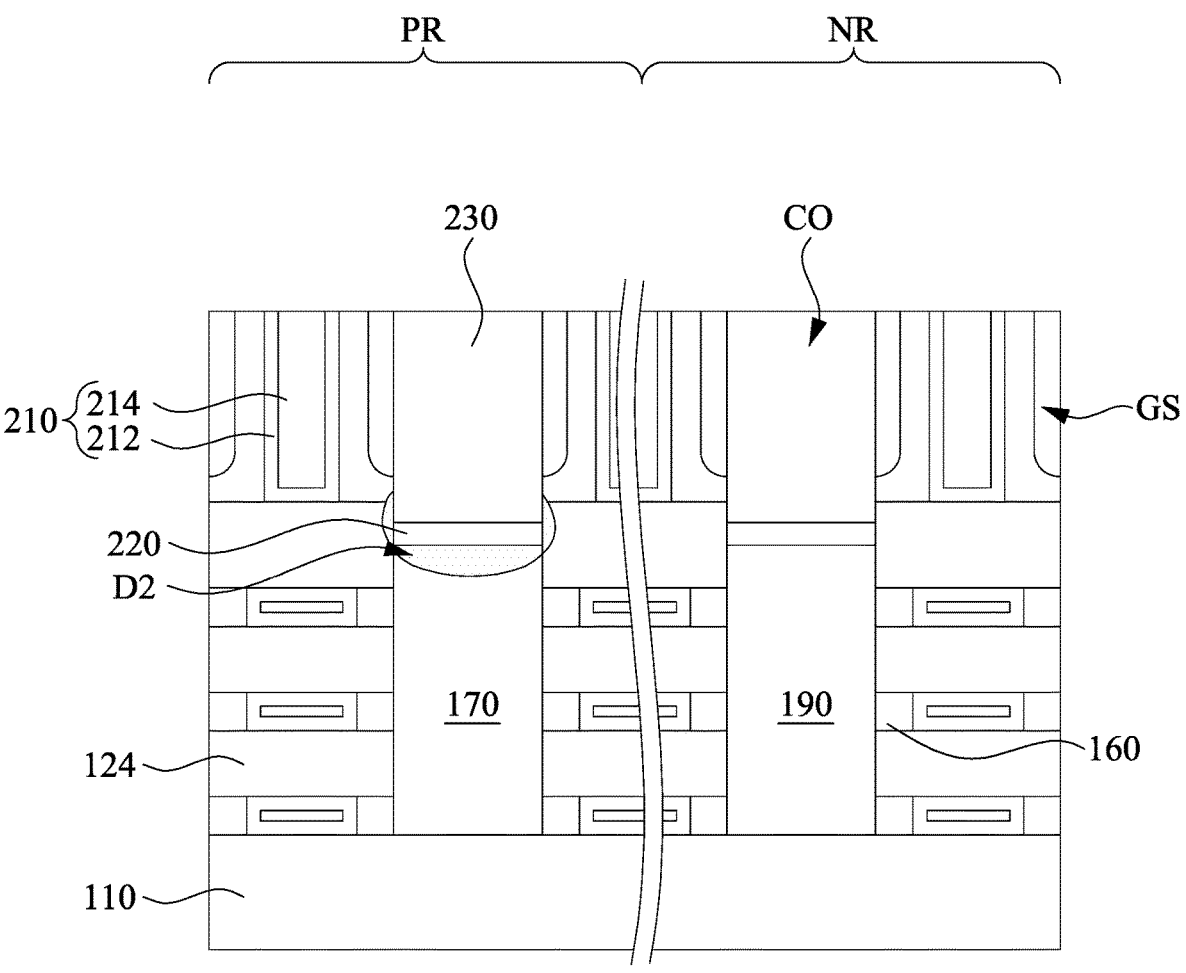

Reference is made to FIG. 11. Source/drain contacts 230 are formed in the source/drain contact openings CO over the source/drain epitaxial structures 170 and 190, respectively. Formation of the source/drain contacts 230 may include depositing conductive materials into the source/drain contact opening CO. The conductive materials deposited into the source/drain contact openings CO may include a barrier layer and a fill metal. The barrier layer may be made of TiN, TaN, or combinations thereof. In some embodiments, the fill metal may be made of metal, such as W, Co, Ru, Al, Cu, or other suitable materials. After the deposition of the conductive materials, a planarization process, such as a chemical mechanical polish (CMP) process, may be then performed to remove excess material external to the source/drain contact opening CO.

In some embodiments, prior to depositing the conductive materials, the metal alloy layers 220 may be respectively formed on the source/drain epitaxial structures 170 and 190 exposed by the source/drain contact opening CO. The metal alloy layers 220, which may be silicide layers, are respectively formed in the source/drain contact opening CO and over the exposed surfaces of the source/drain epitaxial structures 170 and 190, by a self-aligned silicide (salicide) process. The silicide process converts the surface portions of the source/drain epitaxial structures 170 and 190 into the silicide contacts. Silicide processing involves deposition of a metal that undergoes a silicidation reaction with silicon (Si). In order to form silicide contacts on the source/drain epitaxial structures 170 and 190, a metal material is blanket deposited on the exposed surfaces of the source/drain epitaxial structures 170 and 190. After heating the wafer to a temperature at which the metal reacts with the silicon of the source/drain epitaxial structures 170 and 190 to form silicide contacts, unreacted metal is removed. The silicide contacts remain over the surfaces of the source/drain epitaxial structures 170 and 190, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials.

Fluorine would out-diffuse to surface of the source/drain epitaxial structure 170 during one or more annealing processes (e.g., the first and second annealing processes) after the ion implantation process IMP, thereby minimizing dopant activation impact. In some embodiments, fluorine residues resulted from the ion implantation process IMP in source/drain epitaxial structure 170 (e.g., in the regions D1 and D2) may be observed by TEM with EDX mapping. In some embodiments, due to the etching process of the source/drain contact openings CO, fluorine resulted from the ion implantation process IMP in source/drain epitaxial structure 170 (e.g., in the regions D1 and D2) may be partially or entirely removed. Thus, little or no fluorine in source/drain epitaxial structure 170 can be observed by TEM with EDX mapping. In some embodiments, fluorine residues may be observed at the surface of the source/drain epitaxial structure 170 near the source/drain contacts 230 (e.g., in the region R2). For example, at the surface of the source/drain epitaxial structure 170 near the source/drain contacts 230, a fluorine concentration in the source/drain epitaxial structure 170 may be in a range from about 1E17 atoms/cm$^3$ to about 1E18 atoms/cm$^3$.

Figure 12:
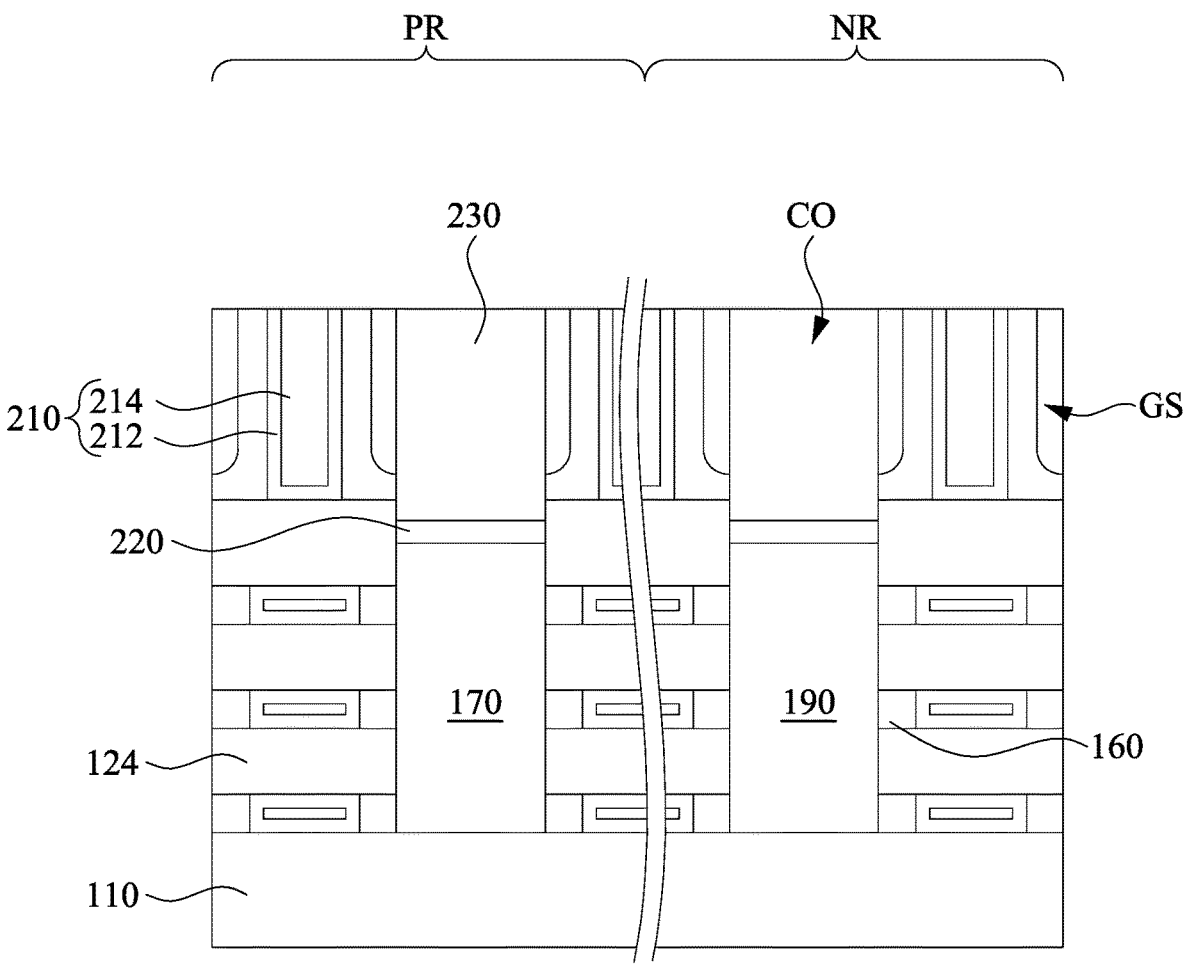
FIG. 12 is a cross-sectional view of a semiconductor device in accordance with some embodiments of the present disclosure.

In the present embodiments, the source/drain contacts 230 and the metal alloy layers 220 are landed on the interstitial-rich region D2, which has a higher defect concentration than other portions below the interstitial-rich region D2. In some embodiments, defects in the region D2 may recover (e.g., the region D2 has a defect concentration similar to other portions below the region D2) by steps in the process (e.g., the first and second annealing process), such that the source/drain contacts 230 and the metal alloy layers 220 would not be landed on an interstitial-rich region, as structure illustrated in FIG. 12.

Figure 13:
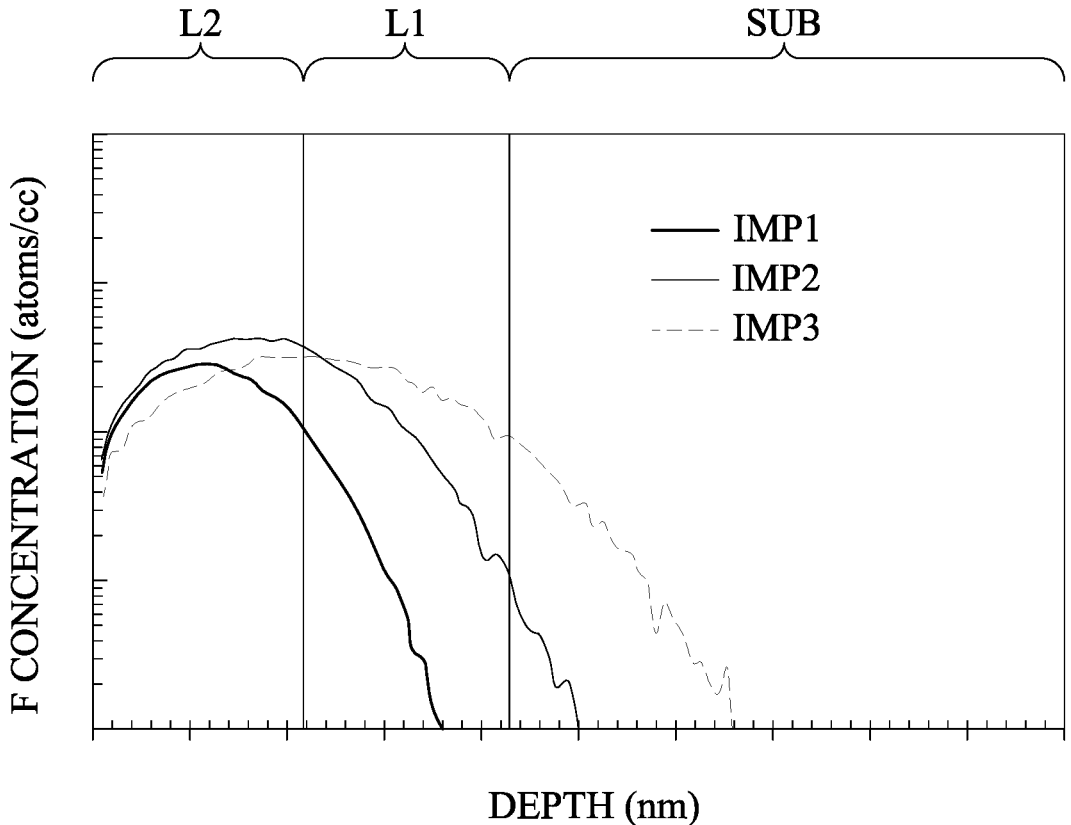
FIG. 13 is a diagram illustrating F concentration versus depth in semiconductor layers before annealing.

FIG. 13 is a diagram illustrating F concentration versus depth in semiconductor layers before annealing. A boron-doped silicon (SiB) layer L1 is deposited over the silicon substrate SUB, and a boron-doped silicon germanium (Si-GeB) layer L2 is deposited over the boron-doped silicon layer L1. The fluorine ion implantation process IMP1-IMP3 are performed to implant fluorine into the semiconductor layers. The energy of the fluorine ion implantation process IMP1-IMP3 increases in a sequence, and the dosage of the fluorine ion implantation process IMP2 is equal to that the ion implantation process IMP3 and higher than that of the fluorine ion implantation process IMP1. As evidenced by FIG. 13, the projected ranges of fluorine in the semiconductor layers caused by the fluorine ion implantation process IMP1-IMP3 increases in a sequence. This indicates that energy and dosages of the ion implantation process would greatly impact the projected ranges of fluorine in the semiconductor layers.

Figure 14:
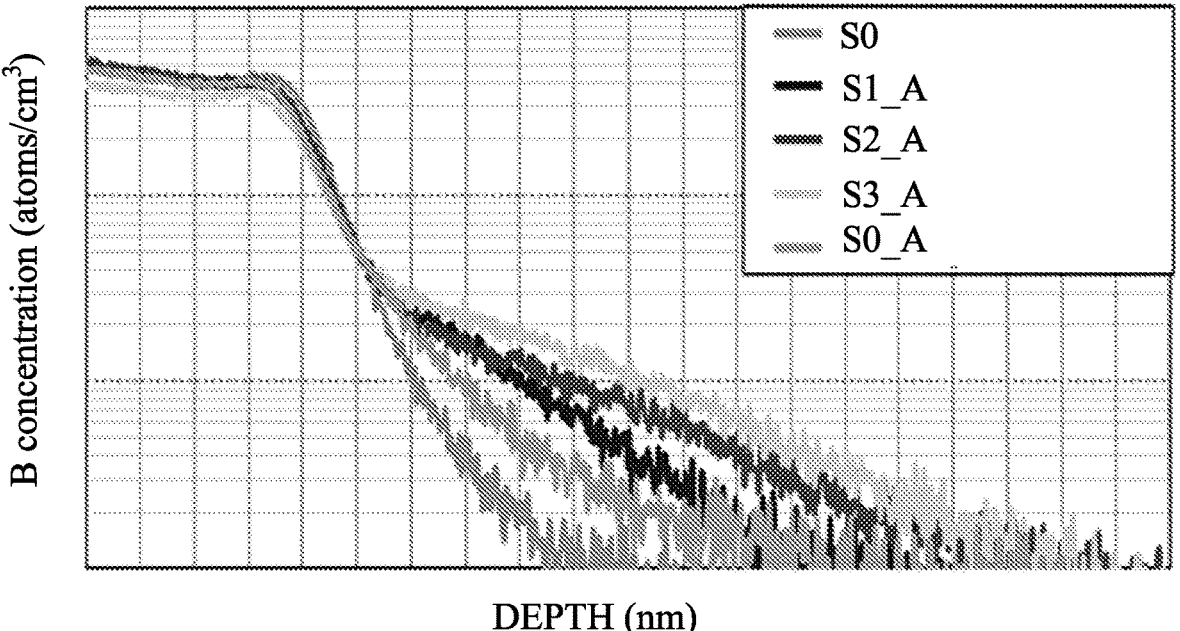
FIG. 14 is a diagram illustrating B concentration versus depth in semiconductor layers after annealing.

FIG. 14 is a diagram illustrating B concentration versus depth in semiconductor layers after annealing. The conditions S0 indicates no fluorine ion implantation process and no annealing process for adjusting the boron junction is performed. The conditions S1_A, S2_A, S3_A indicate the fluorine ion implantation process and the annealing process for adjusting the boron junction are performed, in which the energy of the fluorine ion implantation process in conditions S1_A, S2_A, S3_A increases in a sequence, and the dosage of the fluorine ion implantation process in the condition S2_A is equal to that the fluorine ion implantation process in the condition S3_A and higher than that of the fluorine ion implantation process in the condition S1_A. The condition S0_A indicates no fluorine ion implantation process for adjusting the boron junction is performed, but and an annealing process is performed. It is evidenced from FIG. 14 that, by the fluorine ion implantation process and annealing process, the boron junction is pushed downward by a distance about 2 nanometers to about 4 nanometers. This indicates that the fluorine ion implantation process would greatly impact the boron diffusion in the semiconductor layers.

Figure 15:
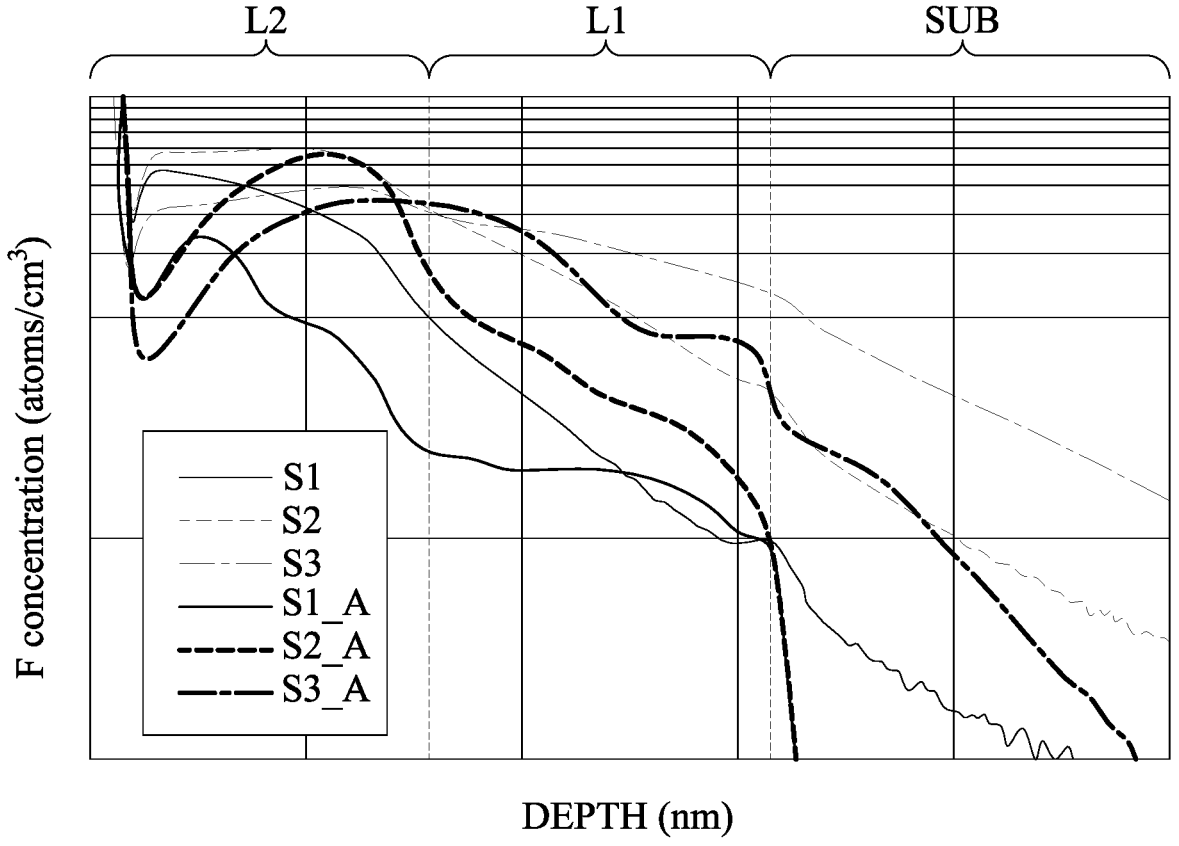
FIG. 15 is a diagram illustrating F concentration versus depth in semiconductor layers before and after annealing.

FIG. 15 is a diagram illustrating F concentration versus depth in semiconductor layers before and after annealing. A boron-doped silicon (SiB) layer L1 is deposited over the silicon substrate SUB, and a boron-doped silicon germanium (SiGeB) layer L2 is deposited over the boron-doped silicon layer L1. The conditions S1 and S1_A indicate the fluorine concentration caused by a first fluorine ion implantation process measured before the annealing process and after annealing process, respectively. The conditions S2 and S2_A indicate the fluorine concentration caused by a second fluorine ion implantation process measured before the annealing process and after annealing process, respectively. The conditions S3 and S3_A indicate the fluorine concentration caused by a third fluorine ion implantation process measured before the annealing process and after annealing process, respectively. The energy of the first fluorine ion implantation process corresponding to the conditions S1 and S1_A, the second fluorine ion implantation process corresponding to the conditions S2 and S2_A, and the third fluorine ion implantation process corresponding to the conditions S3 and S3_A increases in a sequence. The dosage of the second fluorine ion implantation process in the conditions S2 and S2_A is equal to that the third fluorine ion implantation process in the conditions S3 and S3_A and higher than that of the first fluorine ion implantation process in the conditions S1 and S1_A.

In FIG. 15, comparing the conditions S1 and S1_A, the fluorine loss is range from about 50% to about 70%. Comparing the conditions S2 and S2_A, the fluorine loss is range from about 35% to about 40%. Comparing the conditions S3 and S3_A, the fluorine loss is range from about 30% to about 45%. As a result, it is can be inferred that that the lower implantation energy would lead to the higher fluorine loss. Also, compared with the conditions S3 and S3_A, the conditions S1 and S1_A and the conditions S2 and S2_A has less fluorine remain in substrate SUB.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the F implantation process and the annealing process are performed for push boron junction into Si channel to reduce effective channel length, thereby improving nanosheet channel resistance and boosting drive current performance of nano sheet device. Another advantage is that the F implantation process and the annealing process have a minor impact on epitaxial quality since the F out-diffusion and the contact opening etching, which is good for activation. Still another advantage is that a boron junction profile is adjusted by the F implantation process and the annealing process to be a taper and gentle dopant profile for good Vt uniformity.

According to some embodiments of the present disclosure, a method for manufacturing a semiconductor device is provided. The method includes forming a plurality of semiconductor layers vertically stacked over a substrate, wherein the semiconductor layers are vertically spaced apart from each other; forming a source/drain epitaxial structure on sides of the semiconductor layers, wherein the source/drain epitaxial structure is doped with a p-type doping species; implanting fluorine ions into the source/drain epitaxial structure; after implanting fluorine ions into the source/drain epitaxial structure, performing an annealing process to diffuse the p-type doping species into a side region of a topmost one of the channel layers; and forming a source/drain contact over the source/drain epitaxial structure.

According to some embodiments of the present disclosure, a method for manufacturing a semiconductor device is provided. The method includes forming a plurality of first semiconductor layers vertically stacked over a substrate, wherein the first semiconductor layers are vertically spaced apart from each other; forming a plurality of second semiconductor layers vertically stacked over a substrate, wherein the second semiconductor layers are vertically spaced apart from each other; forming a p-type source/drain epitaxial structure on sides of the first semiconductor layers; performing an ion implantation process and an annealing process to diffuse a p-type doping species in the p-type source/drain epitaxial structure into a topmost one of the first semiconductor layers; after the ion implantation process and the annealing process, forming a n-type source/drain epitaxial structure on sides of the second semiconductor layers; forming a first source/drain contact over the p-type source/drain epitaxial structure; and forming a second source/drain contact over the n-type source/drain epitaxial structure.

According to some embodiments of the present disclosure, a semiconductor device includes semiconductor layers, a gate structure, a gate spacer, and a p-type source/drain epitaxial structure. The semiconductor layers are vertically spaced apart from each other. The gate structure wraps around the semiconductor layers. The gate spacer is alongside the gate structure. The p-type source/drain epitaxial structure is on sides of the semiconductor layers. The p-type source/drain epitaxial structure comprises a p-type dopant species. A side portion of a topmost one of the semiconductor layers directly below the gate spacer has a concentration of the p-type dopant species greater than that of a side portion of a second topmost one of the semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a plurality of semiconductor layers vertically stacked over a substrate, wherein the semiconductor layers are vertically spaced apart from each other;
   forming a source/drain epitaxial structure on sides of the semiconductor layers, wherein the source/drain epitaxial structure is doped with a p-type doping species;
   implanting fluorine ions into the source/drain epitaxial structure;
   after implanting the fluorine ions into the source/drain epitaxial structure, performing a first annealing process to diffuse the p-type doping species into a side region of a topmost one of the semiconductor layers; and
   forming a source/drain contact over the source/drain epitaxial structure.

2. The method of claim 1, wherein the p-type doping species is boron.

3. The method of claim 1, wherein the fluorine ions are implanted into the source/drain epitaxial structure by a projected range, and a position below a top surface of the source/drain epitaxial structure by the projected range is higher than a bottom surface of the topmost one of the semiconductor layers and lower than a top surface of the topmost one of the semiconductor layers.

4. The method of claim 1, wherein the annealing process is performed such that a concentration of the p-type doping species in the side region of the topmost one of the semiconductor layers is greater than about 1E19 atoms/cm$^3$.

5. The method of claim 1, further comprising:
   forming a gate structure over the semiconductor layers; and
   forming a gate spacer alongside the gate structure, wherein the side region of the topmost one of the semiconductor layers is at least directly below the gate spacer.

6. The method of claim 5, wherein the side region of the topmost one of the semiconductor layers is further directly below the gate structure.

7. The method of claim 1, wherein implanting the fluorine ions into the source/drain epitaxial structure is performed such that a region of the source/drain epitaxial structure comprises the fluorine ions.

8. The method of claim 7, wherein forming the source/drain contact is performed such that the region of the source/drain epitaxial structure comprising the fluorine ions is partially removed.

9. The method of claim 7, wherein forming the source/drain contact is performed such that the region of the source/drain epitaxial structure comprising the fluorine ions is entirely removed.

10. A method for manufacturing a semiconductor device, comprising:
   forming a plurality of first semiconductor layers vertically stacked over a substrate, wherein the first semiconductor layers are vertically spaced apart from each other;
   forming a plurality of second semiconductor layers vertically stacked over a substrate, wherein the second semiconductor layers are vertically spaced apart from each other;
   forming a p-type source/drain epitaxial structure on sides of the first semiconductor layers;
   performing an ion implantation process and a first annealing process to diffuse a p-type doping species in the p-type source/drain epitaxial structure into a topmost one of the first semiconductor layers;
   after the ion implantation process and the annealing process, forming a n-type source/drain epitaxial structure on sides of the second semiconductor layers;
   performing a second annealing process to activate the p-type source/drain epitaxial structure and the n-type source/drain epitaxial structure;
   forming a first source/drain contact over the p-type source/drain epitaxial structure; and
   forming a second source/drain contact over the n-type source/drain epitaxial structure.

11. The method of claim 10, wherein the second annealing process is performed at a temperature higher than a temperature of the first annealing process.

12. The method of claim 10, wherein the ion implantation process is performed such that the p-type source/drain epitaxial structure has a defect-rich region that has a higher defect concentration than a defect concentration of a portion of the p-type source/drain epitaxial structure below the defect-rich region.

13. The method of claim 12, wherein forming the first source/drain contact is performed such that the first source/drain contact is landed on the defect-rich region of the p-type source/drain epitaxial structure.

14. The method of claim 10, further comprising:
   forming a gate structure over the first semiconductor layers and the second semiconductor layers;
   forming a gate spacer alongside the gate structure;
   before the ion implantation process and the first annealing process, depositing a metal-containing compound layer over a sidewall of the gate spacer and a top surface of the p-type source/drain epitaxial structure; and
   etching the metal-containing compound layer to expose the top surface of the p-type source/drain epitaxial structure.

15. The method of claim 14, further comprising:
   after the first annealing process, removing the metal-containing compound layer from the sidewall of the gate spacer.

16. A semiconductor device, comprising:
   a plurality of semiconductor layers vertically spaced apart from each other;
   a gate structure wrapping around the semiconductor layers;
   a gate spacer alongside the gate structure; and
   a p-type source/drain epitaxial structure on sides of the semiconductor layers, wherein the p-type source/drain epitaxial structure comprises a p-type dopant species, and a side portion of a topmost one of the semiconductor layers directly below the gate spacer has a concentration of the p-type dopant species greater than that of a side portion of a second topmost one of the semiconductor layers.

17. The semiconductor device of claim 16, wherein the p-type dopant species is boron.

18. The semiconductor device of claim 16, wherein a top portion of the p-type source/drain epitaxial structure comprises fluorine residues.

19. The semiconductor device of claim 16, wherein the concentration of the p-type dopant species of the side portion of the topmost one of the semiconductor layers is greater than about 1E19 atoms/cm$^3$.

20. The semiconductor device of claim 16, wherein the concentration of the p-type dopant species of the side portion of the second topmost one of the semiconductor layers is less than about 1E19 atoms/cm$^3$.

\* \* \* \* \*